United States Patent
Williams et al.

(10) Patent No.: US 11,873,224 B2
(45) Date of Patent: Jan. 16, 2024

(54) POLYCRYSTALLINE CHEMICAL VAPOUR DEPOSITION SYNTHETIC DIAMOND MATERIAL

(71) Applicant: ELEMENT SIX TECHNOLOGIES LIMITED, Didcot (GB)

(72) Inventors: Gruffudd Trefor Williams, Didcot (GB); Richard Stuart Balmer, Didcot (GB); Joseph Michael Dodson, Ascot (GB)

(73) Assignee: Element Six Technologies Limited, Didcot (GB)

( * ) Notice: Subject to any disclaimer, the term of this patent is extended or adjusted under 35 U.S.C. 154(b) by 586 days.

(21) Appl. No.: 17/055,405

(22) PCT Filed: May 14, 2019

(86) PCT No.: PCT/EP2019/062256
§ 371 (c)(1),
(2) Date: Nov. 13, 2020

(87) PCT Pub. No.: WO2019/219630
PCT Pub. Date: Nov. 21, 2019

(65) Prior Publication Data
US 2021/0206647 A1    Jul. 8, 2021

(30) Foreign Application Priority Data
May 14, 2018 (GB) ...................... 1807787

(51) Int. Cl.
*C01B 32/26* (2017.01)
*C01B 32/25* (2017.01)
(Continued)

(52) U.S. Cl.
CPC .............. *C01B 32/26* (2017.08); *C01B 32/25* (2017.08); *C23C 16/274* (2013.01);
(Continued)

(58) Field of Classification Search
CPC ......... C01B 32/25; C01B 32/26; C23C 16/52; C23C 16/274; C23C 16/511
See application file for complete search history.

(56) References Cited

U.S. PATENT DOCUMENTS

| | | | |
|---|---|---|---|
| 2007/0196263 A1 | 8/2007 | Hemley et al. | |
| 2014/0349068 A1 | 11/2014 | Inglis et al. | |
| 2015/0222087 A1* | 8/2015 | Williams | C30B 25/105 427/575 |

FOREIGN PATENT DOCUMENTS

| | | |
|---|---|---|
| GB | 2497671 A | 6/2013 |
| WO | 2013087797 A1 | 6/2013 |
| WO | 2014026930 A1 | 2/2014 |

OTHER PUBLICATIONS

Twitchen et al., "Thermal conductivity measurements on CVD diamond", Diamond and Related Materials, 2001, pp. 731-735, vol. 10, Elsevier Science B.V.

(Continued)

*Primary Examiner* — Elizabeth E Mulvaney
(74) *Attorney, Agent, or Firm* — Kilpatrick Townsend & Stockton LLP

(57) ABSTRACT

A polycrystalline CVD synthetic diamond material is provided that has an average thermal conductivity at room temperature through a thickness of the polycrystalline CVD synthetic diamond material of between 1700 and 2400 $Wm^{-1}K^{-1}$, a thickness of at least 2.5 mm and a visible transmittance through the thickness of the polycrystalline CVD synthetic diamond of at least 25%. A wafer comprising the material is also provided, wherein at least 70% of a total area of the wafer has the properties of the polycrystalline CVD synthetic diamond material. A method for fabricating the wafer is also disclosed.

8 Claims, 9 Drawing Sheets

(51) Int. Cl.
*C23C 16/27* (2006.01)
*C23C 16/511* (2006.01)
*C23C 16/52* (2006.01)

(52) U.S. Cl.
CPC ............ *C23C 16/511* (2013.01); *C23C 16/52* (2013.01); *C01P 2006/32* (2013.01); *C01P 2006/60* (2013.01); *C01P 2006/90* (2013.01)

(56) References Cited

OTHER PUBLICATIONS

United Kingdom Patent Application No. GB1807787.5, Combined Search and Examination Report dated Aug. 1, 2018, 6 pages.
United Kingdom Patent Application No. GB1906747.9, Combined Search and Examination Report dated Oct. 9, 2019, 6 pages.
International Patent Application No. PCT/EP2019/062256, International Search Report and Written Opinion dated Jul. 11, 2019, 15 pages.

* cited by examiner

POLYCRYSTALLINE CHEMICAL VAPOUR DEPOSITION SYNTHETIC DIAMOND MATERIAL

FIELD OF INVENTION

The present invention relates to the fabrication of polycrystalline chemical vapour deposition (CVD) synthetic diamond material, and methods for making such material.

BACKGROUND OF INVENTION

Chemical vapour deposition (CVD) processes for synthesis of diamond material are well-known in the art. Being in the region where diamond is metastable compared to graphite, synthesis of diamond under CVD conditions is driven by surface kinetics and not bulk thermodynamics. Diamond synthesis by CVD is normally performed using a small fraction of carbon (typically <5%), typically in the form of methane although other carbon containing gases may be utilized, in an excess of molecular hydrogen. If molecular hydrogen is heated to temperatures in excess of 2000 K, there is a significant dissociation to atomic hydrogen. In the presence of a suitable substrate material, synthetic diamond material can be deposited.

A microwave plasma activated CVD diamond synthesis system typically comprises a plasma reactor vessel coupled both to a supply of source gases and to a microwave power source. The plasma reactor vessel is configured to form a resonance cavity supporting a standing microwave. Source gases including a carbon source and molecular hydrogen are fed into the plasma reactor vessel and can be activated by the standing microwave to form a plasma in high field regions. If a suitable substrate is provided in close proximity to the plasma, reactive carbon containing radicals can diffuse from the plasma to the substrate and be deposited thereon. Atomic hydrogen can also diffuse from the plasma to the substrate and selectively etch off non-diamond carbon from the substrate such that diamond growth can occur.

A range of possible microwave plasma reactors for synthetic diamond film growth using a CVD process are known in the art. Such reactors have a variety of different designs. Common features include: a plasma chamber; a substrate holder disposed in the plasma chamber; a microwave generator for forming the plasma; a coupling configuration for feeding microwaves from the microwave generator into the plasma chamber; a gas flow system for feeding process gases into the plasma chamber and removing them therefrom; and a temperature control system for controlling the temperature of a substrate on the substrate holder.

Using microwave plasma reactors such as those disclosed in the prior art it is possible to grow polycrystalline diamond wafers by chemical vapour deposition on a suitable substrate such as a silicon wafer or a carbide forming refractory metal disk. Such polycrystalline CVD diamond wafers are generally visibly opaque in their as-grown form but can be made transparent by polishing opposing faces of the wafers to produce transparent polycrystalline diamond windows for optical applications.

Diamond material is useful as a heat conducting component as it has a high thermal conductivity. For example, as illustrated in FIG. 1, a disk laser may comprise a heat spreading substrate S on which a thin disk of laser gain material LGM is disposed. The thin disk is also often called an active mirror because it acts as a mirror with laser gain. The heat spreading substrate may be subjected to a coolant C for extracting and removing heat therefrom. An output coupler O is positioned opposite the active mirror to form an optical cavity. The active mirror is pumped with, for example, a diode laser DL and high powered laser light is emitted through the output coupler. It is known to use a polycrystalline CVD synthetic diamond wafer as a heat spreading substrate for mounting the active mirror of a disk laser. Diamond material has been found to be useful in such an application because of its extremely high thermal conductivity. Furthermore, diamond material has a very low thermal expansion coefficient such that thermal distortion is low.

The thermal performance of a polycrystalline CVD synthetic diamond wafer is dependent on the physical dimensions of the wafer (diameter and thickness) and the 'quality' of the diamond material forming the wafer. For example, a thick, large area wafer will tend to have better heat spreading functionality than a thin, small area wafer. Furthermore, it is known that thermal conductivity is affected by grain size, impurities and/or defects such as non-diamond carbon which are incorporated into the diamond material during growth. In addition, material quality is intimately linked with wafer geometry and growth rate. For example, growing wafers to increased thickness tends to increase the rate at which impurities and/or defects are incorporated into a polycrystalline CVD synthetic diamond wafer. Furthermore, growing wafers to increased diameter tends to increase the rate at which impurities and/or defects are incorporated into a polycrystalline CVD synthetic diamond wafer, particularly at a periphery of the wafers. Further still, growing wafers at increased growth rate tends to increase the rate at which impurities and/or defects are incorporated into a polycrystalline CVD synthetic diamond wafer.

As lasers have increasingly high power, the thickness of the wafer must increase. However, it is very difficult to grow wafers of thickness greater than around 2 mm because growing wafers to increased thickness, diameter, and/or growth rate can also lead to problems of wafer cracking during the synthesis process.

One solution to providing thicker diamond wafers is to join two wafers together. However, this leads to an interface between the wafers that can introduce regions of low thermal conductivity, and so this solution is not desirable.

A further problem is that the UV and/or visible light transmission of diamond wafers is very low. In some circumstances, some transmission at visible or UV wavelengths is desirable. However, existing techniques for manufacturing polycrystalline diamond wafers do not give adequate transmission, typically because of grain boundary scattering and black spots.

In light of the above, it is an aim of certain embodiments of the present invention to provide a lower cost microwave plasma CVD diamond synthesis process in order to fabricate thick polycrystalline CVD synthetic diamond wafers having high thermal conductivity for heat conducting applications such as in disk lasers.

SUMMARY OF INVENTION

It is an object to provide a polycrystalline synthetic diamond material with improved transmission properties and properties adequate for use as a heat conductor.

According to a first aspect, there is provided a polycrystalline CVD synthetic diamond material comprising an average thermal conductivity at room temperature through a thickness of the polycrystalline CVD synthetic diamond material of between 1700 and 2400 $Wm^{-1}K^{-1}$, a thickness of at least 2.5 mm and a visible transmittance through the thickness of the polycrystalline CVD synthetic diamond of at least 25%.

As an option, the material has two opposing external major faces and the material is substantially crack free such that there are no cracks that intersect both external major faces of the polycrystalline CVD synthetic diamond material.

The average thermal conductivity at room temperature through the thickness of the polycrystalline CVD synthetic diamond material is optionally at least 1750 $Wm^{-1}K^{-1}$, 1800 $Wm^{-1}K^{-1}$, 1850 $Wm^{-1}K^{-1}$, 1900 $Wm^{-1}K^{-1}$, or 1950 $Wm^{-1}K^{-1}$.

The polycrystalline CVD synthetic diamond material optionally has a diameter of at least 20 mm.

As an option, the thickness is at least 2.75 mm, 3.0 mm, 3.25 mm, or 3.5 mm.

The visible transmittance through the thickness of the polycrystalline CVD synthetic diamond is optionally selected from at least 25%, at least 30%, at least 35%, at least 40%, at least 45% and at least 50%.

According to a second aspect, there is provided a polycrystalline CVD synthetic diamond wafer comprising an average thermal conductivity at room temperature through a thickness of the polycrystalline CVD synthetic diamond material of between 1700 and 2400 $Wm^{-1}K^{-1}$ measured over at least a central area of the polycrystalline CVD synthetic diamond wafer, wherein the central area is at least 70% of a total area of the polycrystalline CVD synthetic diamond wafer, a thickness of at least 2.5 mm; and a visible transmittance through the thickness of the polycrystalline CVD synthetic diamond wafer of at least 25% over at least the central area of the polycrystalline CVD synthetic diamond material.

As an option, the wafer has opposing external major surfaces and the wafer is substantially crack free over at least the central area such that the central area has no cracks which intersect both external major faces of the polycrystalline CVD synthetic diamond material.

The polycrystalline CVD synthetic diamond wafer optionally has an as-grown diameter in the range 60 mm to 120 mm, 80 mm to 110 mm, 90 mm to 110 mm, or 95 mm to 105 mm.

The diameter of the central area is optionally at least 75%, 80%, 85%, 90%, 95%, or 99% of the as-grown diameter of the polycrystalline CVD synthetic diamond wafer. As an option, the visible transmittance through the thickness of the central area of the polycrystalline CVD synthetic diamond wafer is selected from at least 25%, at least 30%, at least 35%, at least 40%, at least 45% and at least 50%.

According to a third aspect, there is provided a method of fabricating a polycrystalline CVD synthetic diamond wafer. The method comprises loading a refractory metal substrate into a CVD reactor, introducing microwaves into the CVD reactor at a known power density in terms of power per unit area of the refractory metal substrate, introducing process gas into the CVD reactor, wherein the process gas within the CVD reactor comprises nitrogen, a carbon containing gas, and hydrogen, controlling an average temperature of the refractory metal substrate to lie in a range 750° C. to 950° C. and to maintain a temperature difference between an edge and a centre point on the refractory metal substrate of no more than 80° C., and growing polycrystalline CVD synthetic diamond material to a thickness of at least 2.5 mm on the refractory metal substrate. During the growing stage, the pressure of the process gas is increased and the average power per unit area of the refractory metal substrate is reduced. The polycrystalline CVD synthetic diamond wafer is subsequently cooled to yield a polycrystalline CVD synthetic diamond having a thickness of at least 2.5 mm, an average thermal conductivity at room temperature through the thickness of the polycrystalline CVD synthetic diamond wafer of between 1700 and 2400 $Wm^{-1}K^{-1}$ over at least a central area of the polycrystalline CVD synthetic diamond material, wherein the central area is at least 70% of a total area of the polycrystalline CVD synthetic diamond wafer, and wherein the polycrystalline CVD synthetic diamond wafer is substantially crack free over at least the central area thereof such that the central area has no cracks which intersect both external major faces of the polycrystalline CVD synthetic diamond wafer and extend greater than 2 mm in length.

As an option, the pressure of the process gas within the CVD reactor is increased such that the pressure at the end of the growing stage is at least any of 5, 10 and 15% higher than the pressure at the start of the growing stage.

The refractory metal substrate optionally has a diameter which lies in a range 60 mm to 120 mm, 80 mm to 110 mm, 90 mm to 110 mm, or 95 mm to 105 mm.

The gap between the edge of the refractory metal substrate and the refractory metal guard ring optionally has a width in a range 2.0 mm to 4.0 mm, or 2.5 mm to 3.5 mm.

As an option, a nitrogen concentration in the process gas within the CVD reactor, calculated as molecular nitrogen $N_2$, lies in a range 600 to 1500 ppb, 700 ppb to 1300 ppb, 800 ppb to 1200 ppb, or 900 ppb to 1100 ppb.

As an option, the carbon containing gas concentration of the process gas within the CVD reactor lies in a range 1.5% to 3%, 1.6% to 2.5%, 1.7% to 2.3%, or 1.8 to 2.1% by volume.

Optionally, the hydrogen concentration of the process gas within the CVD reactor lies in a range 92% to 98.5%, 94% to 97%, or 95% to 96% by volume.

As an option, the average temperature of the refractory metal substrate is controlled to lie in a range 775° C. to 900° C., 800° C. to 875° C., or 820° C. to 860° C.

As an option, a temperature difference between the edge and the centre point on the refractory metal substrate is no more than 60° C., 40° C., 20° C., or 10° C.

The power density is optionally in a range 2.5 to 4.5 W $mm^{-2}$, 2.75 to 4.25 W $mm^{-2}$, 3.0 to 4.0 W $mm^{-2}$, 3.2 to 3.8 W $mm^{-2}$, or 3.3 to 3.6 W $mm^{-2}$.

As an option, an operating pressure during growth of the polycrystalline CVD synthetic diamond material is controlled within a range 100 to 300 Torr, 150 to 250 Torr, 175 to 225 Torr, or 195 to 205 Torr.

The method optionally further comprises, after loading the refractory metal substrate into the CVD reactor, locating a refractory metal guard ring around a peripheral region of the refractory metal substrate, the refractory metal guard ring defining a gap between an edge of the refractory metal substrate and the refractory metal guard ring having a width 1.5 mm to 5.0 mm.

According to a fourth aspect, there is provided a method of making a polycrystalline CVD synthetic diamond material as described above in the first aspect. A polycrystalline CVD synthetic diamond wafer is fabricated using the method described above in the third aspect. The wafer is then processed to remove a portion of the wafer and leave the polycrystalline CVD synthetic diamond material.

BRIEF DESCRIPTION OF THE DRAWINGS

For a better understanding of the present invention and to show how the same may be carried into effect, embodiments of the present invention will now be described by way of example only with reference to the accompanying drawings, in which.

DETAILED DESCRIPTION

Figure 1:
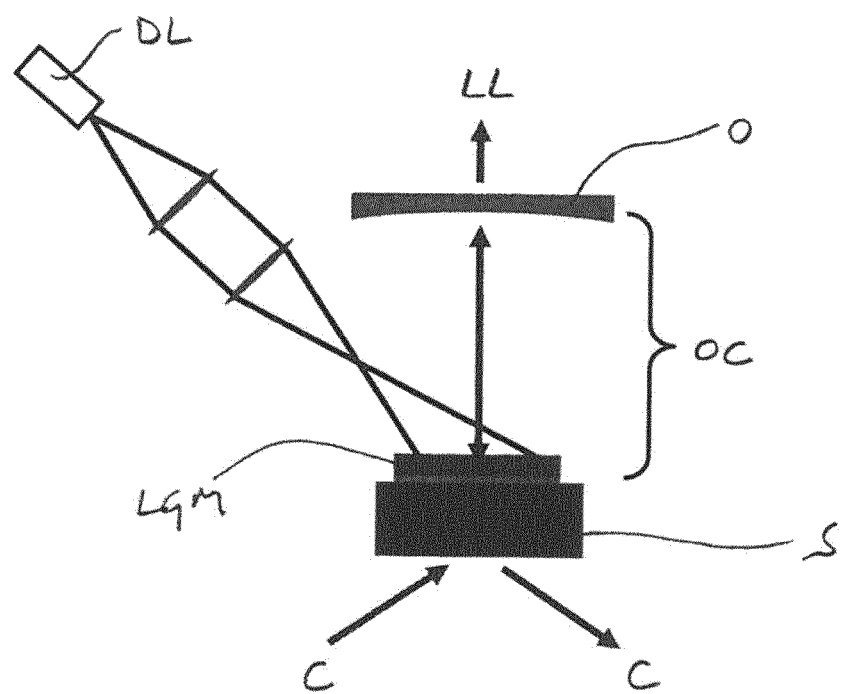
FIG. 1 illustrates a known disk laser comprising a diamond heat spreading substrate.
Figure 2:
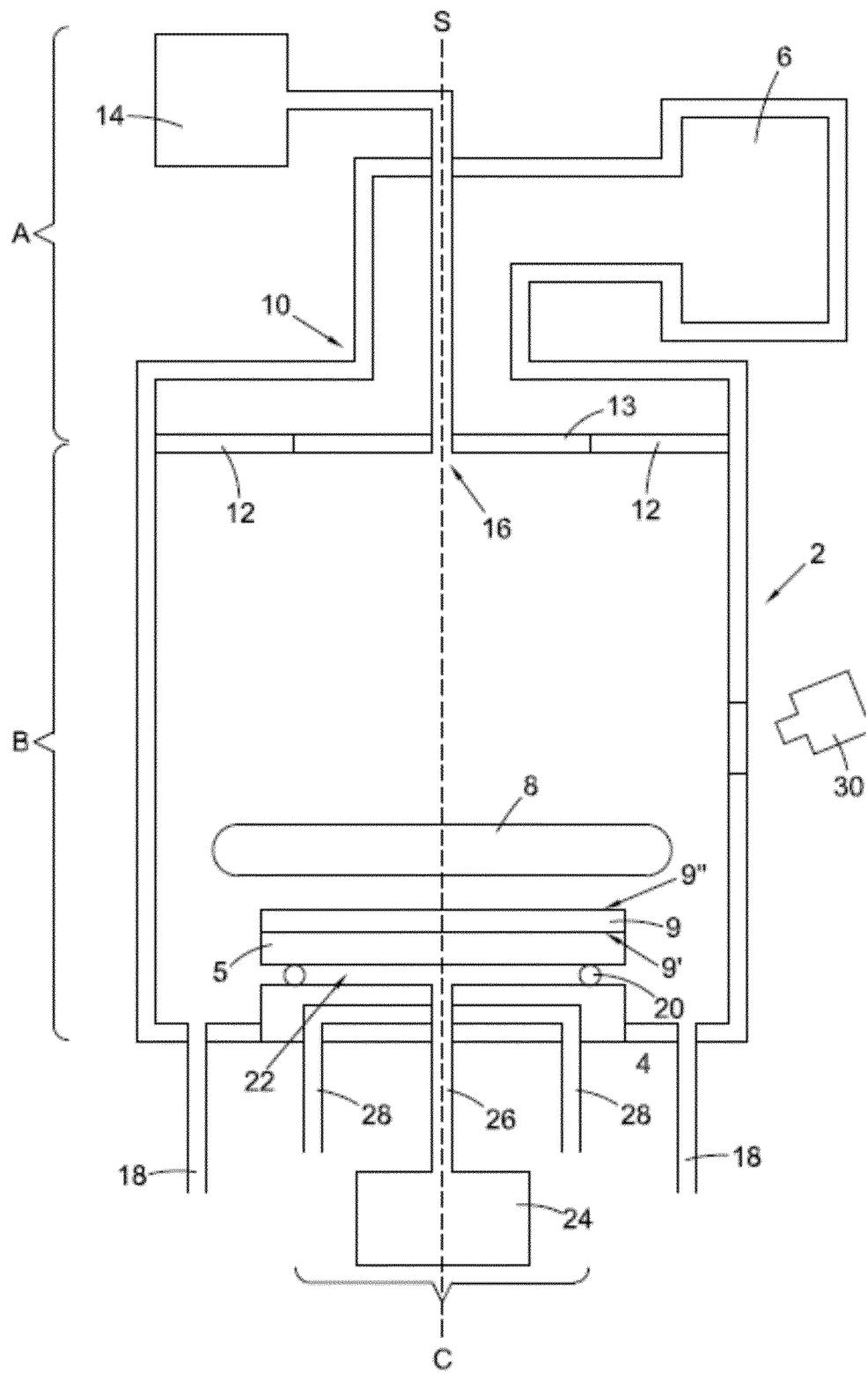
FIG. 2 illustrates a microwave plasma reactor configured to fabricate thick, high thermal conductivity polycrystalline CVD diamond wafers.

The microwave plasma reactor illustrated in FIG. 2 comprises the following components: a plasma chamber 2; a substrate holder 4; a substrate 5; a microwave generator 6; plasma 8 generated in use for growing a polycrystalline CVD diamond wafer 9 having a nucleation face 9' and a growth face 9"; a microwave coupling configuration 10; dielectric window 12; source gas container system 14; one or more gas inlets 16; one or more gas outlets 18; spacer wires or spacer pads 20 to define a gas gap 22 between a supporting surface of the substrate holder 4 and a rear surface of the substrate 5; and a substrate temperature control arrangement comprising a gas supply system 24 coupled to the gas gap 22 via a supply pipe 26, and a coolant liquid supply system 28 for cooling the substrate holder.

The microwave plasma reactor can be considered to comprise three subsystems: (A) gas and microwave delivery systems configured to deliver process gases and microwaves into a plasma chamber through a top plate of the plasma chamber; (B) a plasma chamber comprising a base, a top plate, and a side wall extending from the base to the top plate defining a resonance cavity for supporting a microwave resonance mode, the resonance cavity comprising a central rotational axis of symmetry S extending from the base to the top plate; and (C) a substrate mounting configuration comprising a substrate holder disposed in the base of the plasma chamber providing a supporting surface for supporting a substrate on which the polycrystalline CVD diamond wafer can be grown in use and a substrate temperature control system comprising a coolant delivery system for supplying liquid and/or gas coolant to the substrate holder to control a temperature profile across the supporting surface of the substrate holder in use.

Each of the subsystems will be described in more detail below.

(A) the Gas and Microwave Delivery System

The microwave coupling configuration 10 comprises a coaxial waveguide configured to feed microwaves from a rectangular waveguide to an annular dielectric window 12. The coaxial waveguide comprises an inner conductor and an outer conductor. The annular dielectric window is made of a microwave permeable material such as quartz which forms a vacuum-tight window in a top portion of the plasma chamber. The microwave generator 6 and the microwave coupling configuration 10 are configured to generate a suitable wavelength of microwaves and inductively couple the microwaves into the plasma chamber to form a standing wave within the plasma chamber having a high energy anti-node located just above the substrate 5 in use.

Figure 3A:
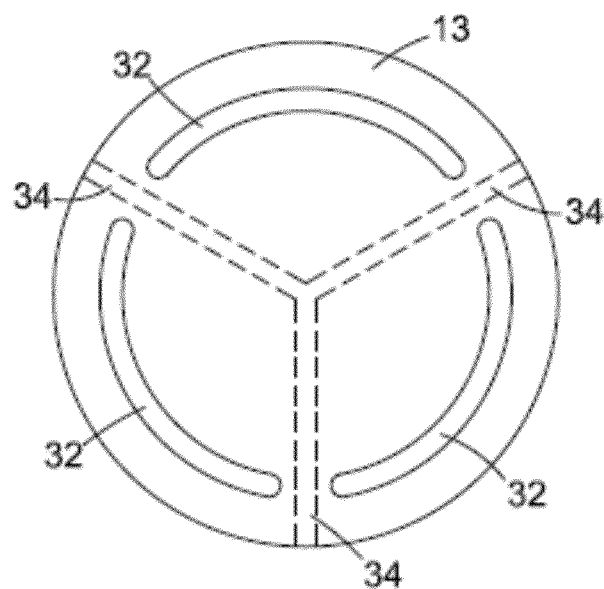
FIGS. 3(a), 3(b) and FIG. 4 illustrate components of a microwave coupling configuration for coupling microwaves into a plasma chamber.
Figure 3B:
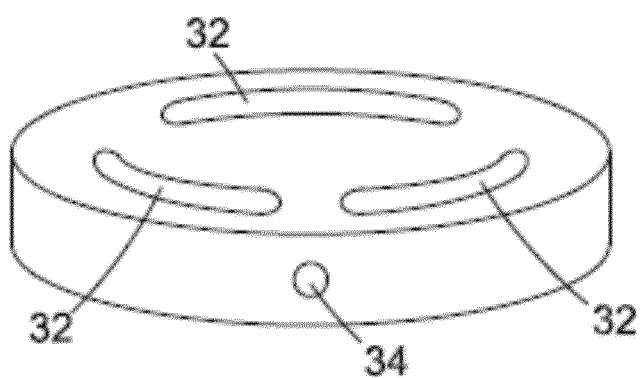

The microwave coupling configuration 10 further comprises a waveguide plate 13. The waveguide plate 13 and its mounting configuration are illustrated in more detail in FIGS. 3(a), 3(b), and 4. The waveguide plate 13 comprising a plurality of apertures 32 disposed in an annular configuration, each aperture forming a waveguide for coupling microwaves from the coaxial waveguide into the plasma chamber through the annular dielectric window 12. The waveguide plate may also comprise a plurality of channels 34 extending between the apertures suitable for supplying coolant and/or process gas from an outer circumferential region to an inner axial region.

This configuration has been found to be advantageous as it allows microwave power to be coupled into the plasma chamber via an annular dielectric window while also allowing of the provision of coolant and/or process gases to regions of the plasma chamber enclosed by the waveguide structure.

In addition to the above, the waveguide plate can be configured to support the central conductor of the coaxial waveguide. Accordingly, while the central conductor illustrated in FIG. 2 is a grounded post, in one alternative arrangement the central conductor can be formed as an electrically floating post which is not required to be grounded on an upper wall of the rectangular waveguide from the microwave generator. An inner conductor which is electrically floating in the waveguide is in many respects a simpler and more convenient method of transferring power from a rectangular to a coaxial waveguide. This has the disadvantage of losing the grounded point at which services such as coolant water and process gas can be introduced through the central conductor as shown in FIG. 2. However, certain embodiments of the present invention provide an alternative route for supplying such services via channels in the waveguide plate.

Furthermore, the waveguide plate can be configured to couple together upper and lower portions of the plasma chamber and avoid large compressive stresses on the annular dielectric window in use without the use of a mechanical anchor point through a central conductor of the coaxial waveguide. Further still, the annular dielectric window may comprise two opposing surfaces through which microwaves are coupled into the plasma chamber and seals may be provided on said two opposing surfaces. This allows for a reliable seal to be formed between upper and lower portions of the plasma chamber and at the dielectric window.

Figure 4:
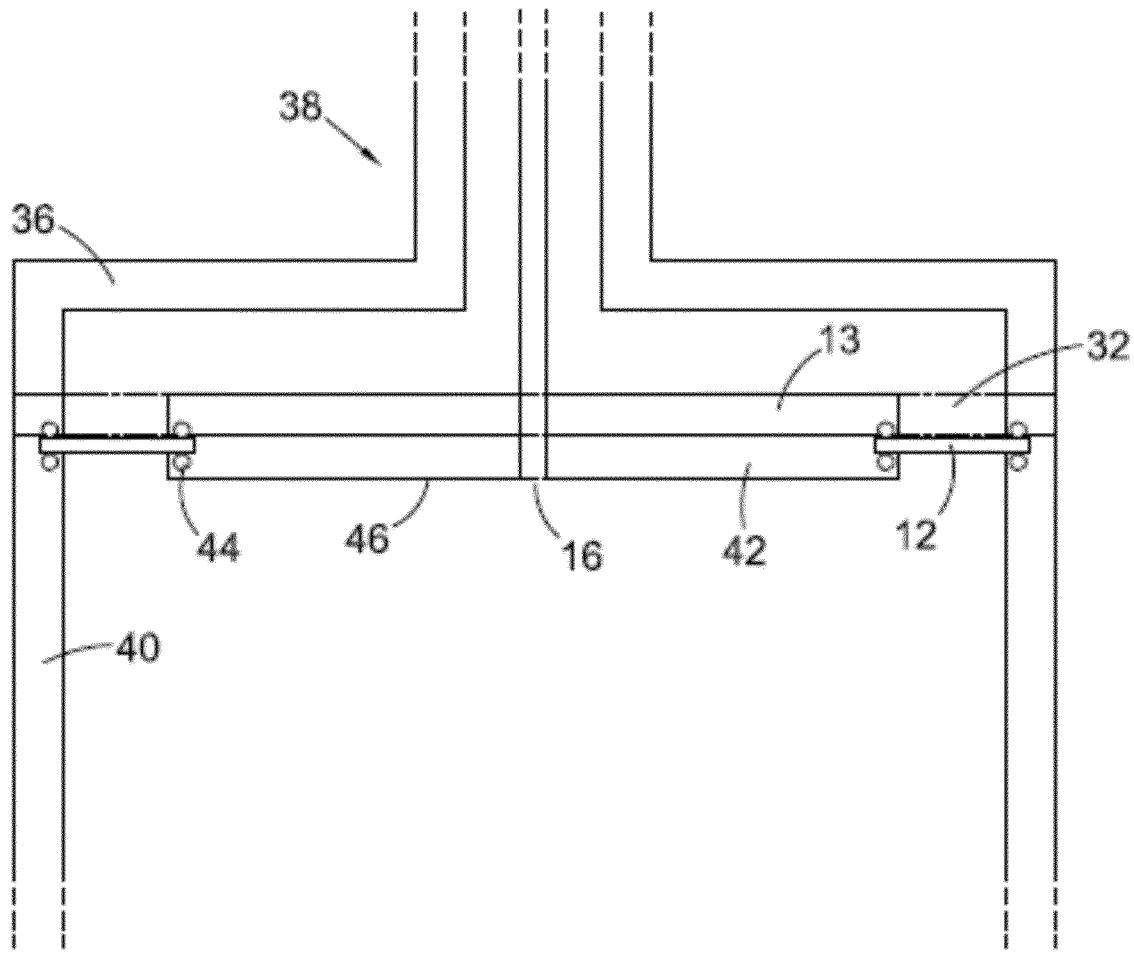

FIG. 4 shows a cross-sectional view of a portion of the microwave plasma reactor illustrating an example of how the annular dielectric window 12 and waveguide plate 13 can be mounted in the reactor. In the illustrated arrangement, an outer peripheral portion of the waveguide plate 13 is disposed between the outer conductor 36 of the coaxial waveguide 38 and a side wall 40 of the plasma chamber. An outer peripheral portion of the annular dielectric window 12 is disposed between the waveguide plate 13 and the side wall 40 of the plasma chamber. An inner portion of the annular dielectric window 12 is held between an inner portion of the waveguide plate 13 and a further plate 42. The apertures 32 in the waveguide plate are aligned with the annular dielectric window 12 and channels 34 for supplying coolant and/or process gas pass between the apertures into the inner portion of the waveguide plate 13. The annular dielectric window 12 may be mounted to the waveguide plate using elastomer o-rings 44. In this arrangement the further plate 42 can be attached to the waveguide plate 13 with a portion of the dielectric window 12 disposed and held therebetween via elastomeric o-rings 44.

The waveguide plate as described above fulfils several advantageous functions:
 (i) it allows injection of coolant and/or process gases;
 (ii) it supports the central coaxial conductor;
 (iii) it forms a coupling between the upper and lower parts of the plasma chamber;
 (iv) it feeds microwaves from the coaxial waveguide into the plasma chamber in an axial direction towards the substrate; and
 (v) it supports an annular dielectric window.

In the illustrated embodiment, the plurality of apertures in the waveguide plate are configured to couple microwaves into the plasma chamber in a direction parallel to a central axis of the plasma chamber. In this arrangement, the waveguide plate is disposed in a plane perpendicular to a central axis of the plasma chamber and forms a portion of an upper wall in the plasma chamber. It has been found that coupling microwaves into the plasma chamber in a direction parallel to the axis of the chamber is more efficient and avoids the need for a more complex coaxial feed configuration. As such, even if channels for coolant and/or process gas are not provided in the waveguide plate, and/or no floating post is provided, the waveguide plate according to the present invention is still advantageous for coupling microwaves into the plasma chamber in an efficient and simple manner.

The plurality of apertures are preferably configured to have a periodic rotational symmetry. For example, if n apertures are provided, the apertures are configured symmetrically around a circle to have n fold rotational symmetry. A symmetric arrangement is preferred to avoid asymmetries in the electric field within the plasma chamber formed as a result of asymmetries in the apertures.

The annular dielectric window as previously described is formed of a single complete ring of dielectric material. However, in an alterative arrangement the annular dielectric window may be formed of a plurality of separate arcuate segments, each segment sealed across a corresponding aperture of the waveguide plate.

In one configuration the one or more channels extending between the apertures in the waveguide plate comprise at least one channel configured to supply process gas to one or more injection ports arranged opposite the substrate holder for injecting process gas towards the substrate holder. This configuration allows an axial gas flow arrangement to be disposed at the same end of the chamber as the microwave coupling configuration.

A central portion of the waveguide plate can support a conductive surface 46 disposed opposite the substrate holder. The conductive surface may be formed by the waveguide plate or may be formed by a separate metallic body which is connected to a central portion of the waveguide plate. One or more gas inlet nozzles 16 may be disposed in the conductive surface for injecting process gas towards the substrate holder. In one configuration, the conductive surface is curved and extends towards a central region of the plasma chamber. For example, the conductive surface may form a cone-shaped body. Such a conductive surface is useful as it can aid in preventing plasma formation in an upper region of the plasma chamber. Effectively, the conductive surface can mask off a high electric field region in use. That is, the conductive surface can be located to enclose a high electric field anti-node region which would exist in a corresponding chamber which did not comprise the conductive surface extending towards a central region of the plasma chamber.

The waveguide plate may include 2, 3, 4, 5, 6, 7 or more apertures. It has been found that varying the number of apertures can affect the efficiency at which microwaves are coupled into the plasma chamber. According to certain arrangements, the waveguide plate comprises an odd number of apertures, most preferably a prime number of apertures. For example, the waveguide plate may comprise 3, 5, or 7 apertures.

Each aperture is in effect equivalent to a rectangular waveguide. A three way aperture can help to maximize the length of the aperture. Four and six way alternatives have both been found to be deficient from the point of view of mode stability. Despite the presence of several apertures, the power can be predominantly coupled into the cavity in a $TM_{0\ mn}$ mode. There are effects from the symmetry of the apertures visible in the form of the generation of high order modes i.e. $TM_{l\ mn}$ (where l does not equal zero). Thus a three way aperture in which all three apertures are excited in phase will couple to the $TM_{3\ mn}$ series of modes while the four and six way apertures might be expected to couple with the much higher order $TM_{8\ mn}$ and $TM_{12\ mn}$ modes. In practice however, the four and six way apertures are prone to parasitic modes. Thus a four or six way aperture can couple into the $TM_{2\ mn}$ modes. Overall the effect is that the four and six way apertures can produce asymmetries in the plasma that result in either the plasma moving off centre or splitting two ways. The three way aperture gives a stable three way pulling effect that is less undesirable than the more serious one way and two way break-up modes that occur with other configurations. Instabilities can be dealt with using mode cancelling blocks which are basically metal bodies that produce a perturbation to the local electric field that is intended to cancel that of the three way mode produced by the apertures. The position of these metal blocks can be established empirically. By placing them in regions of high wall current (i.e. where the H field is high) the blocks can be used to disrupt the unwanted mode. As such in one arrangement a plurality of mode cancelling blocks are disposed on an inner wall of the plasma chamber, for example on a side wall or on a base of the chamber, the mode cancelling blocks being configured to compensate for electromagnetic perturbations caused by the plurality of apertures. The mode cancelling blocks are spaced apart so as to be symmetrically related to the aperture configuration. For example, the number of mode cancelling blocks may be equal to the number of apertures provided in the waveguide plate, the mode cancelling blocks being positioned to have a symmetry which corresponds to the aperture arrangement. For example, if three apertures are provided in the waveguide plate then three mode cancelling blocks may be mounted around the plasma chamber wall in a lower portion of the plasma chamber and arranged symmetrically so as to cancel perturbations in the electric field caused by the apertures. Alternatively, the number of mode cancelling blocks may be an integer multiple of the number of apertures while still being arranged to be symmetrically related to the aperture configuration. The mode cancelling blocks can be adhered to an inner wall of the plasma chamber or may be integrally formed by a wall of the plasma chamber. Another possible alternative to the three way aperture is to use a five or seven way aperture. Because these are prime numbers they are resistant to over-moding with lower order two way modes etc. In this case the mode cancelling blocks may not be required.

It is further advantageous to supply microwave energy to a plasma chamber via apertures having a specific radial width. A ratio of the annular gap (in a radial direction) provided by the apertures in the waveguide plate to that of a diameter of the plasma chamber may be in the range 1/10 to 1/50, 1/20 to 1/40, 1/25 to 1/35, or optionally approximately 1/30. This annular gap may be provided by locating the apertures adjacent the side wall of the plasma chamber with the outer conductor of the coaxial waveguide being comparable in diameter to the diameter of the resonance cavity of the plasma chamber and the inner conductor being only slightly smaller than the outer conductor to achieve a ratio as previously specified for the annular gap. By varying the ratio of the diameters of these two conductors it is possible to find an optimum point at which a match to the chamber is achieved. In an alternative arrangement, the apertures may be placed away from the side walls of the plasma chamber, e.g. at an intermediate position between the centre and an edge of the top plate. Advantageously, the components of the chamber and microwave coupling assembly should be configured to a high degree of precision, e.g. such that dimensions and positioning of components is within 0.1% of the prescribed specification.

The gas supply system comprises a source gas container system 14, one or more gas inlets 16 and one or more gas outlets 18. One axially disposed gas inlet is illustrated in FIG. 2 in the centre of the top plate of the plasma chamber which also forms the previously described waveguide plate 13. Optionally, the gas inlet can be modified to provide an array of gas inlet nozzles across an area of the top plate of the plasma chamber.

The gas inlet is positioned in a top portion of the plasma chamber directly above the substrate holder and configured to directly feed gas at high velocity towards the substrate. Process gas is removed at one or more outlets in or near the base of the plasma chamber. Optionally, the process gas can be recirculated to the inlet using a pump. An advantage of such a system is that high velocity gas flow directed towards the substrate transports activated gas species from the plasma to the substrate by convection. This aids in increasing growth rates when compared with systems which rely upon diffusion of activated gas species from the plasma to the substrate. Furthermore, as previously discussed, by increasing the hydrogen gas flow rate using such an arrangement it is possible to push more atomic hydrogen to peripheral regions of the polycrystalline diamond wafer thus increasing the rate at which non-diamond carbon is etched from the growth surface and improving the quality of the material in peripheral regions of the growing wafer.

An alternative or additional solution is to provide a gas inlet nozzle array having a plurality of gas inlet nozzles directed towards the growth surface of the substrate and disposed over an area sufficiently large to ensure that a sufficiently large concentration of atomic hydrogen is provided in peripheral regions of a polycrystalline diamond wafer during growth. In this regard, a relatively high number of nozzles can be closely spaced to ensure a relatively uniform flow of gas. It has been found that providing a relatively high number density of nozzles in an array improves the uniformity of gas flow towards the substrate in use and allows the plasma to be uniformly flattened and shaped relative to the substrate to achieve uniform diamond film formation at high rates over a relatively large area. It has also been found to be useful to provide relatively small area nozzles such that the area of the nozzle array is largely made up of the space in-between the nozzles rather than the area of the nozzle outlets themselves. As such, whereas it has been found to be advantageous to provide a relatively large number density of nozzles in relation to the area of the nozzle inlet array, it has also been found to be advantageous to provide an array in which the ratio of the area of the nozzle inlets divided by the area of the nozzle array as a whole is low. It has been found that small nozzles are advantageous for providing high velocity directed gas flows. However, it is also desired to have a relatively uniform gas flow over a relatively large area for uniform deposition of a diamond film over a relatively large area. Accordingly, a combination of relatively small inlet nozzle size and a relatively high number density of such nozzles has been found to be advantageous to achieve a balance between high velocity directed gas flows and uniformity of gas flow over a relatively large area.

In light of the above, a modified gas flow system may comprise a gas inlet nozzle array comprising a plurality of gas inlet nozzles disposed opposite the substrate holder for directing process gases towards the substrate holder, the gas inlet nozzle array comprising: at least six gas inlet nozzles disposed in a substantially parallel or divergent orientation relative to a central axis of the plasma chamber (by substantially parallel we mean at least within 10°, 5°, 2°, or 1° of a perfect parallel arrangement); a gas inlet nozzle number density equal to or greater than 0.1 nozzles/cm², (but preferably much higher for certain applications) wherein the gas inlet nozzle number density is measured by projecting the nozzles onto a plane whose normal lies parallel to the central axis of the plasma chamber and measuring the gas inlet number density on said plane; and a nozzle area ratio of equal to or greater than 10 (but preferably much higher for certain applications), wherein the nozzle area ratio is measured by projecting the nozzles onto a plane whose normal lies parallel to the central axis of the plasma chamber, measuring the total area of the gas inlet nozzle area on said plane, dividing by the total number of nozzles to give an area associated with each nozzle, and dividing the area associated with each nozzle by an actual area of each nozzle.

(B) The Plasma Chamber

The plasma chamber is configured to form a resonance cavity supporting a standing microwave in use. According to one configuration the plasma chamber is configured to support a $TM_{01n}$ standing microwave in use, e.g. a $TM_{011}$ mode. The operational frequency may be in a range 400 to 500 MHz or 800 to 1000 MHz.

It has also been found to be advantageous to provide a cylindrical resonance cavity configured to have a diameter which satisfies the condition that a ratio of the resonance cavity height/the resonance cavity diameter is in the range 0.3 to 1.0, 0.4 to 0.9, or 0.5 to 0.8. Such a ratio constitutes a relatively small diameter cavity when compared to prior art arrangements. Although it would seem counter-intuitive, it has been found that it is advantageous to use a plasma reactor chamber having a relatively small diameter to form a uniform, stable, large area plasma for achieving uniform CVD diamond growth over large areas. A relatively small diameter cavity can provide the following beneficial technical effects:

(i) Improve resonance mode purity within the chamber and avoid complex interactions between numerous modes during operation over the long time-scales required for CVD diamond synthesis. For example, a small diameter chamber can reduce the problem of slight temperature instabilities in the CVD diamond growth surface stimulating an unwelcome higher order mode.

(ii) A cavity formed within a specific, relatively small, diameter range is considered to allow the formation of localized higher order axis-symmetric modes at the substrate making the E-field across the substrate more uniform without forming very intense radial E-fields at the top corners of the substrate.

(iii) A small diameter cavity which has a relatively low Q factor is more easy to start and tune, and is less sensitive to variations in microwave source frequency.

Such a relatively small diameter cavity also helps to alleviate the problem of complex and interacting gas convection currents forming within the chamber leading to plasma instability. That is, the present inventors consider that a small diameter cavity provides a more simple and easier to control system in terms of both gas flow and microwave power within the plasma chamber such that a more uniform, stable, large area plasma can be formed and maintained to achieve uniform CVD diamond growth over large areas. At the same time, the diameter of the cavity should not be so small that the plasma becomes compressed and non-uniform across the substrate.

For example, the resonance cavity height, as measured from the base to the top plate of the plasma chamber, may lie in a range: 300 mm to 600 mm, 300 mm to 500 mm, or 400 mm to 500 mm at a microwave frequency f in the range 400 MHz to 500 MHz; or 150 mm to 300 mm, 150 mm to 250 mm, or 200 mm to 250 mm at a microwave frequency f in the range 800 MHz to 1000 MHz. The resonance cavity diameter may lie in the range: 400 mm to 1000 mm, 500 mm to 900 mm, or 600 mm to 800 mm at a microwave frequency f in the range 400 MHz to 500 MHz; or 200 mm to 500 mm, 250 mm to 450 mm, or 300 mm to 400 mm at a microwave frequency f in the range 800 MHz to 1000 MHz. The resonance cavity may have a volume in a range: 0.018 $m^3$ to 0.530 $m^3$, 0.062 $m^3$ to 0.350 $m^3$, 0.089 $m^3$ to 0.270 $m^3$, or 0.133 $m^3$ to 0.221 $m^3$ at a microwave frequency f in the range 400 to 500 MHz; or 0.002 $m^3$ to 0.06 $m^3$, 0.007 $m^3$ to 0.04 $m^3$, 0.01 $m^3$ to 0.03 $m^3$, or 0.015 $m^3$ to 0.025 $m^3$ at a microwave frequency f in the range 800 MHz to 1000 MHz.

One potentially problem when using a small cavity arrangement as described above is that of over heating in wall components of the chamber. However, it has been found to be advantageous to provide an arrangement in which the walls of the resonance cavity are exposed to the plasma in use, i.e. the plasma is not contained within a bell jar, to avoid silicon contamination. Plasma reactor vessels are usually manufactured from welded stainless steel as this is the accepted material of choice for ultra-high vacuum (UHV) chambers. However, it has been found that this creates problems with arcing at interfaces, soot formation on hot surfaces, and generally poor heat transfer. Furthermore, these chambers cost a large amount of money to build. Aluminium has been found to be a better material thermally and is also easy to machine. Thus, while stainless steel is a good material for vacuum chambers, its very poor thermal performance makes it not well suited to use in areas where high power densities are experienced. Materials such as aluminium, while not traditionally regarded as suitable for high vacuum, are actually quite good for reasonably high vacuum usage where conventional elastomer seals can be used.

In light of the above, the resonance cavity may comprise internal walls configured to be exposed to a plasma formed within the resonance cavity in use, the internal walls comprising metallic surfaces forming at least 75%, 80%, 85%, 90% or 95% of a total surface area of the internal walls within the resonance cavity. The metallic surfaces may be made of aluminium or an alloy thereof comprising at least 80%, 90%, 95%, or 98% by weight of aluminium. Furthermore, a portion of the internal walls formed by the annular dielectric window, is preferably no more than 25%, 20%, 15%, 10%, or 5% of the total surface area of the internal walls within the resonance cavity.

Although a basic cylindrical chamber configuration is illustrated in FIG. 2, additional optional features may be provided. For example, projections from a wall of the chamber may be provided in certain instances. These may be provided to modify the electric field formed near the substrate, introducing a vertical asymmetry which increases the electric field above the substrate relative to the electric field at an opposite end of the plasma chamber where plasma formation is not desirable. In addition, such projections can function as a mode filter, aiding stability and/or purity of the electric field which drives the plasma. Such projections may also be provided to alter the thermal properties of the plasma which can aid in improving uniformity of CVD diamond growth, function as a physical boundary to confine the plasma in use and prevent the plasma from deviating from an axially central location above the substrate, and/or interrupt gas flow up a side wall of the plasma chamber thereby reducing gas entrainment and unwanted convection currents within the chamber which would otherwise destabilize the inlet gas streams and/or the plasma. In such cases, it should be ensured that any additional structure provided within the plasma chamber have a high degree of rotational symmetry and alignment with the rotational symmetry axis of the plasma chamber to achieve good, uniform quality diamond wafers.

(C) The Substrate Mounting Configuration

It has been found that the electric field profile is significantly perturbed when a substrate is introduced into the resonance cavity as can be shown by modelling or empirical measurement. In this regard, FIGS. 5(*a*) to 5(*c*) illustrate electric field profile plots showing how the electric field varies with differing height of a substrate within a resonance cavity of a plasma reactor. The plots show the magnitude of the electric field $E_z$ on the Y-axis against the lateral position X across the diameter of the resonance cavity above the substrate.

Figure 5A:
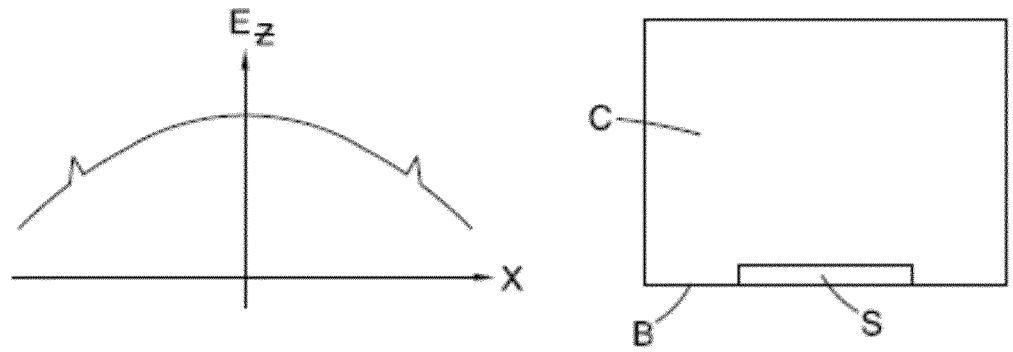
FIGS. 5(a) to 5(c) show electric field profile plots for varying heights of substrate within a microwave plasma reactor.
Figure 5B:
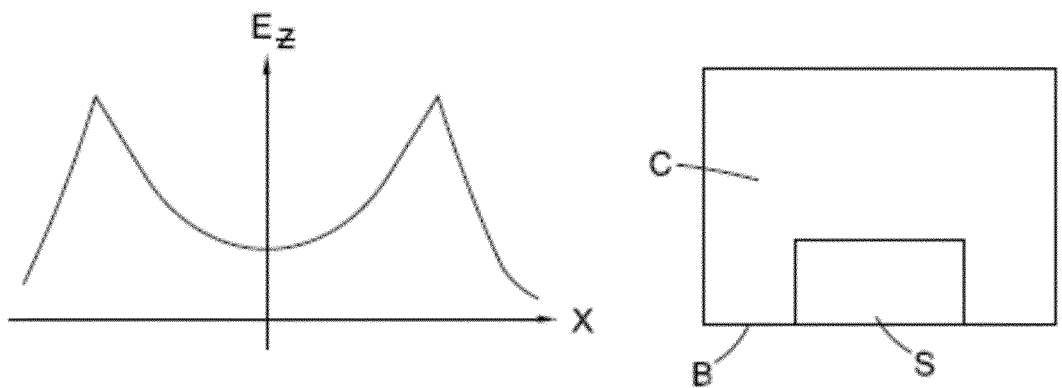

FIG. 5(*a*) illustrates the electric field profile when the growth surface of the substrate S is located just above a base B of the resonance cavity C. The electric field profile is dominated by that of the empty chamber which is a $J_0$ Bessel function for a $TM_{01n}$ chamber. There is only a slight contribution to the electric field magnitude from the upper edge of the substrate forming a coaxial mode set up between the substrate and the chamber wall. In this arrangement, the electric field is high above a central region of the substrate and drops off significantly towards the edge of the substrate. As such, this electric field profile results in poor CVD diamond growth in a peripheral region of the substrate growth surface.

FIG. 5(*b*) illustrates the electric field profile when the growth surface of the substrate S is located high above the base B of the resonance cavity C. The electric field profile is now dominated by the coaxial mode set up between the substrate and the chamber wall which decays evanescently into a central region of the chamber. In this arrangement, the electric field is high above a peripheral region of the substrate and drops off towards the central region of the substrate. As such, this electric field profile results in poor CVD diamond growth in a central region of the substrate growth surface.

Figure 5C:
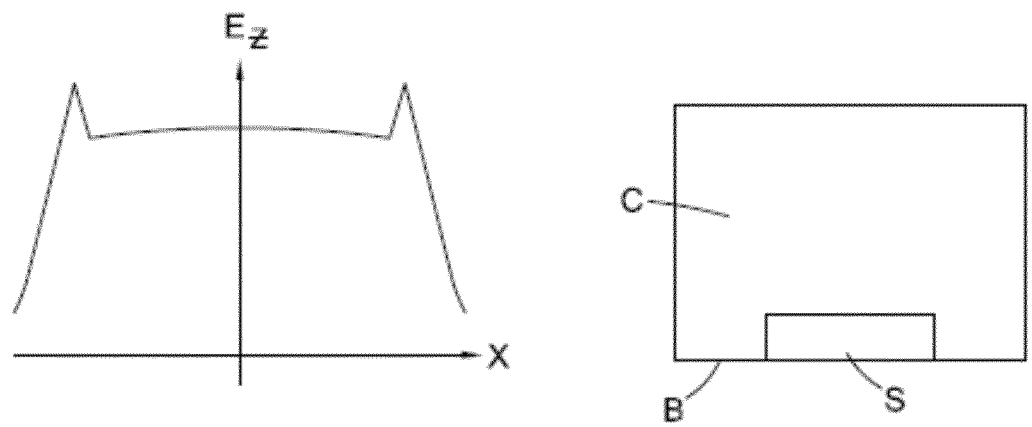

FIG. 5(c) illustrates the electric field profile when the growth surface of the substrate S is located at the correct height above a surrounding surface within the resonance cavity C. The electric field profile of the empty chamber is balanced with the coaxial mode set up between the substrate and the chamber wall to form a substantially uniform electric field region over the majority of the substrate with a ring of higher electric field localized around the substrate edge. The central region of the electric field is substantially uniform but has a slightly lower electric field region just inside the ring of higher electric field localized around the substrate edge. One would think that this lower electric field region would lead to poor CVD diamond growth at this region of the growth surface. However, in practice it has been found that the higher electric field ring immediately outside the region of lower electric field aids in pulling the plasma outwards, compensating for the slight non-uniformity in the central region and resulting in a large, flat, uniform plasma over the majority of the substrate enabling uniform CVD diamond growth over large areas. In practice, it has been found that a large, flat, uniform plasma over the majority of the substrate enabling uniform CVD diamond growth over large areas can be achieved when a ratio of substrate diameter/height of the growth surface of the substrate is in a range 10 to 14, 11 to 13.5, or 11.0 to 12.5, wherein the height of the growth surface of the substrate is relative to a mean height of a surface surrounding the substrate.

According to certain embodiments of the present invention the substrate holder has a rotational axis of symmetry lying within 1.0 mm, 0.5 mm, 0.25 mm, 0.2 mm, 0.15 mm, 0.10 mm, or 0.05 mm of the central rotational axis of symmetry of the resonance cavity. Furthermore, in use a substrate may be located and aligned on the substrate holder such that a the rotation axis of symmetry of the substrate lies within 1.0 mm, 0.5 mm or 0.2 mm of the central rotational axis of symmetry of the resonance cavity when located over the substrate holder.

Figure 6A:
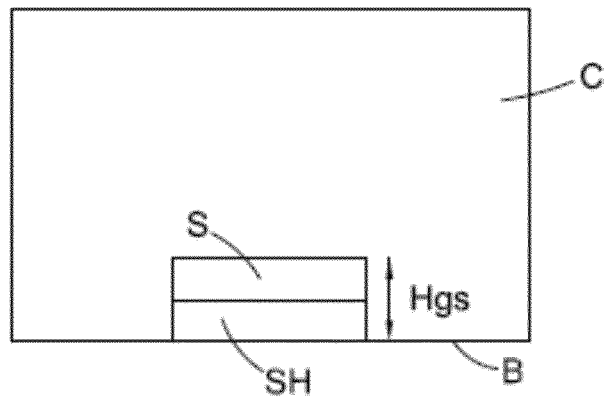
FIGS. 6(a) to 6(c) show how the height of the growth surface of the substrate is calculated relative to a mean height of a surface surrounding the substrate.
Figure 6B:
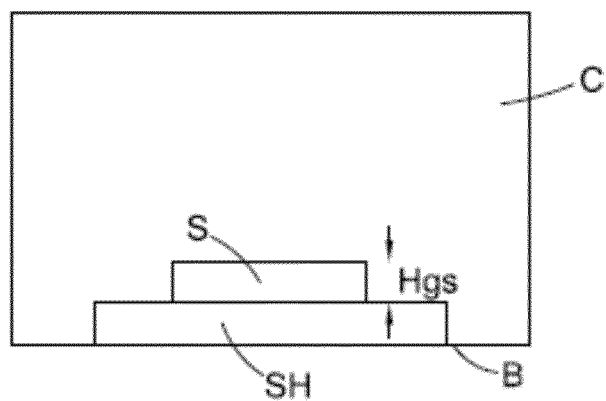

For an arrangement in which the substrate holder is the same diameter as the substrate, the substrate holder will be located wholly under the substrate and the surface surrounding the substrate may be formed by the base of the plasma chamber. As such, in this case the mean height of the surface surrounding the substrate will equate to the height of the base B of the plasma chamber C and the height of the growth surface of the substrate, $H_{gs}$, will be measured from the base of the plasma chamber surrounding the substrate S and substrate holder SH as illustrated in FIG. 6(a). Alternatively, for an arrangement in which the substrate holder is much larger than the substrate thus forming a large flat surface which surrounds the substrate, the mean height of the surface surrounding the substrate will equate to a top surface of the substrate holder. As such, in this case the height of the growth surface of the substrate, $H_{gs}$, will be measured from the top surface of the substrate holder SH surrounding the substrate S as illustrated in FIG. 6(b). For an arrangement in which the substrate holder extends outwards from the substrate with a sloped, curved, or stepped top surface surrounding the substrate then the mean height of the local surrounding surface, $H_{lss}$, can be defined by a mean of a height, $H_{local}$, of a cross section between the edge of the substrate, at Rs, and a distance approximately two times the thickness of the substrate, 2×Ts, away from the substrate edge, taken in a radial direction, $$X: H_{lss} = \frac{1}{2Rs} \int_{Rs}^{Rs+2Ts} H_{local} dX$$

Figure 6C:
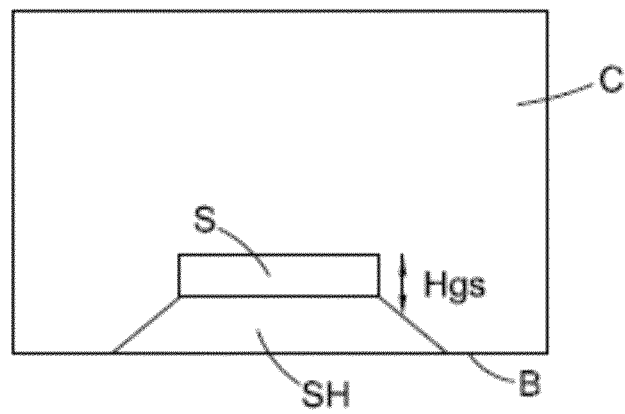

Such an arrangement is illustrated in FIG. 6(c) for a sloped substrate holder. For example, for a substrate holder having a top surface sloping away from the substrate at an angle of 45° to a distance 2×Ts from the substrate in a radial direction, the mean height of the surface surrounding the substrate will equate to half the height of the substrate holder SH. As such, in this case the height of the growth surface of the substrate, $H_{gs}$, will be measured from half the height of the substrate holder SH.

In relation to the above, it has been found that providing a step of a particular height between the substrate growth surface and the local surrounding surface perturbs the electric field profile of the plasma chamber in such a way that the electric field profile of the empty chamber is balanced with a coaxial mode set up between the substrate and the chamber wall to form a substantially uniform electric field region over the majority of the substrate with a ring of higher electric field localized around the substrate edge as previously described.

The magnitude of the coaxial mode set up between the substrate and the chamber wall can also be affected by the ratio of a resonance cavity diameter/substrate diameter. Accordingly, in certain arrangements it may be preferred to provide a configuration in which a ratio of resonance cavity diameter/substrate diameter is in the range 1.5 to 5, 2.0 to 4.5, or 2.5 to 4.0, wherein the resonance cavity diameter is measured at a height less than 50%, 40%, 30%, or 20% of a height of the resonance cavity. In one particularly preferred arrangement the aforementioned ratios hold when the resonance cavity diameter is measured at a height of the growth surface of the substrate.

Providing suitable substrate dimensions and correctly locating the substrate within the plasma chamber can thus aid providing a more uniform plasma over larger areas. Furthermore, the uniform plasma achieved by such configurations also provides relatively uniform heat flow towards the substrate which has been found to aid in alleviating the problem of cracking of the CVD diamond when the CVD diamond cools after growth. In this regard, stress balance in a CVD diamond wafer is largely determined by the variation in growth temperatures over the diamond wafer. Hotter regions during growth contract to a greater extent during cool down, and are therefore in tension; cooler regions contract less, and therefore remain in compression. Variations in stress, in particular local tensile stresses, within the CVD diamond wafer during cooling can result in cracking. As such, large variations in substrate temperature are not desirable.

That said, one potential problem using the previously described arrangement is that the high electric field ring disposed around the edge of the substrate can lead to higher substrate temperatures at the edge of the substrate and this can potentially lead to cracking of the substrate when the CVD diamond material cools after growth. Indeed, rather than having a completely uniform temperature across the substrate growth surface as might be intuitively desired, the present inventors consider that it is actually desirable to ensure that the edge temperature of the substrate growth surface is lower that the temperature in a central region of the substrate growth surface. The reason for such an arrangement is that crack propagation can be minimised by ensuring that compressive regions within the CVD diamond material are near where cracks can originate, i.e. near the edge of the CVD diamond wafer.

Accordingly, keeping the edge of the substrate growth surface slightly cooler than a central region during growth is considered to be advantageous in forming a compressive region near the edge of the resulting CVD diamond wafer. If a crack is initiated at an edge of a CVD diamond wafer during cooling, the compressive region near the edge of the CVD diamond wafer prevents the crack from propagating towards the centre of the CVD diamond wafer. As such, any cracks which are initiated tend to remain short and located at an outer edge of the CVD diamond wafer which can subsequently be processed to remove any minor edge damage. In this regard, it is advantageous to provide a substrate temperature control system an example of which is illustrated in the reactor configuration of FIG. 2.

The substrate 5 is spaced apart from the substrate holder 4 by spacer wires or spacer pads 20 to define a gas gap 22 between a supporting surface of the substrate holder 4 and a rear surface of the substrate 5. Furthermore a gas supply system 24 is coupled to the gas gap 22 via a supply pipe 26 which extends from the gas supply system 24 through the substrate holder 4 and is configured to supply gas into the gas gap 22 through one or more outlets in the supporting surface of the substrate holder. A coolant liquid supply system 28 is also provided for cooling the substrate holder 4.

The coolant liquid supply system 28 provides a rough basic cooling to the substrate holder. However, this system has been found to be insufficiently precise for the fine temperature control of the substrate which is considered to be required by the present inventors in order to obtain high quality, uniform deposition of CVD diamond over large areas. Accordingly, the gas supply system 24, 26 is provided in order to allow more precise control of the substrate temperature. The gas supply system may be configured to inject at least two gases having different thermal conductivities into the gas gap below the substrate and vary a ratio of the at least two gases in order to control the temperature of the substrate on the substrate holder. For example, the gas supply system may utilize a mixture of a light gas such as hydrogen and a heavy gas such as argon which is less thermally conductive. Advantageously, the gases used to control the temperature of the substrate are ones which are also utilized in the main process chemistry so that additional gas sources are not required. If the edge temperature of the substrate is too high relative to the central region of the substrate, the proportion of heavy gas relative to light gas can be increased to reduce the thermal conductivity of the gas under a central region of the substrate, thus causing the central region of the substrate to heat up relative to the edge of the substrate. Conversely, if the edge temperature of the substrate is too low relative to the central region of the substrate, the proportion of light gas relative to heavy gas can be increased to increase the thermal conductivity of the gas under a central region of the substrate, thus causing the central region of the substrate to cool down relative to the edge of the substrate. The absolute temperature of the substrate as well as the relative temperature of different regions of the substrate can also be controlled by varying gas flow and gas composition within the gas gap under the substrate.

The spacer wires 16 may be configured to define a central gas gap cavity under the substrate so that the gas pools in the central gas gap cavity. For example, the spacer wires 16 can be each arcuate in shape and configured into a ring with gaps therebetween through which gas can flow. The spacer elements may be electrically conductive and/or may be fixed in place with an electrically conductive adhesive such as Silver DAG™ which has been found to be useful in ensuring a good electrical contact between the spacer elements and the substrate holder. This aids in preventing the problem of arcing under the substrate which can detrimentally affect temperature control. It has also been noted that the position of gaps between the ring sections of the spacer wires can produce a variation in thickness of the diamond wafer. If desired, the number and position can be adjusted to compensate for other non-uniformities inherent in diamond wafers produced by a given reactor.

The microwave plasma reactor further comprises one or more temperature measurement devices configured to take at least two temperature measurements, including one or more measurements in a central region of the growth surface of the substrate and one or more measurements in a peripheral region of the growth surface of the substrate as previously described. The temperature measurements may be taken simultaneously or within a short time interval of each other and the substrate temperature control system may be used to ensure that the temperature gradient does not move outside the previously described ranges. The temperature measurement device may comprise a pyrometer 30 as illustrated in FIG. 2. Two pyrometers may be provided, one to take the central temperature measurements and one to take the peripheral temperature measurements.

Microwave plasma reactors may comprise further features such as a metallic temperature modifying ring disposed around the substrate. Such a temperature modifying ring performs two roles: it moves the ring of high electric field away from the substrate edge; and, being a separately heated (by plasma) and cooled (by the chamber base) item, it directly modifies the substrate edge temperature. As such, the ring can function to cool the edge of the substrate, reducing the magnitude of any tensile stresses, making cracking of the CVD diamond less likely. In addition, adjusting the temperature modifying ring disposed around the substrate can also modify overgrowth of CVD diamond down the edge of the substrate thereby aiding release of the CVD diamond material from the substrate. As with previously described structures, if any such a ring structure is provided within the plasma chamber then it should be ensured that it is rotationally symmetric and precisely aligned relative to the rotational axis of the plasma chamber to prevent asymmetries which are detrimental when growing large area synthetic diamond wafers.

The substrate temperature control system may be configured to control the temperature of the growth surface of the substrate during CVD diamond growth thereon to fulfil the condition: $5°\ C. < T_c - T_e < 120°\ C.$; $10°\ C. < T_c - T_e < 100°\ C.$; $10°\ C. < T_c - T_e < 80°\ C.$; $20°\ C. < T_c - T_e < 80°\ C.$; or $20°\ C. < T_c - T_e < 60°\ C.$, where $T_c$ is a temperature in the central region of the growth surface and $T_e$ is a temperature in the peripheral region of the growth surface. If $T_c - T_e$ becomes too large, excessive tension may be created in the central region of the CVD diamond wafer during cooling, leading to cracking in the central region of the CVD diamond wafer. If $T_c - T_e$ becomes too small, compressive regions will not form near the edge of the CVD diamond wafer and any cracks which initiate at the edge of the wafer are more likely to propagate across the CVD diamond wafer resulting in very long cracks, including complete wafer fracture.

Even when utilizing arrangements such as those described above, a number of problems may still exist, although these may be substantially alleviated by the previously described arrangements. For example, in some instances there may still be issues of non-uniform CVD diamond growth across the substrate, diamond wafer delamination from the substrate during CVD diamond growth, and crack initiation and/or propagation during cooling after growth of the CVD diamond wafer, particularly when larger substrates are used for growing large area polycrystalline diamond discs. This is particularly problematic as there is an on going need to increase the area over which high quality, uniform CVD diamond can be grown. Furthermore, these problems tend to be exacerbated when the substrates are reused in subsequent growth runs. This is particularly problematic for refractory metal substrates which are expensive and reuse is desirable in an economically competitive industrial process.

One possible solution considered by the inventors was that the quality of the growth surface was in some way affecting the release of a CVD diamond wafer on cooling after growth thus causing cracking. Processing the growth surface to have a more precisely defined flatness and roughness did not in itself solve the problems. It has been found that the problems observed are a result of small variations in temperature across the growth surface of the substrate caused by very minor variations in the height of the gas gap under the substrate. In particular, the present inventors found that although the cylindrical refractory metal substrates provided by their supplier have nominally planar front and rear surfaces, these surfaces are not sufficiently flat. Minor flatness variations in a rear surface of the substrate result in minor variations in the height of the gas gap and it has been found that this results in differential cooling across the substrate. The temperature variations caused by the variations in the gas gap height result in stress variations in the CVD diamond on cooling after CVD diamond growth which can cause the diamond wafer to crack in at least a proportion of growth runs resulting in reduced yields.

While the previously described arrangements can control variations in temperature which are circumferentially symmetric, it can be more difficult to control temperature variations which are not circumferentially symmetric such as those caused by variations in the gas gap height. For example, refractory metal substrates tend to sag and buckle during use (despite being a long way from their melting point). Uniform sag mainly modifies $T_c$-$T_e$ which can be controlled as previously described. However, buckling introduces non-uniformities in the temperature around the wafer edge which are not symmetric. Therefore it is not easy to maintain the whole edge in compression. Typical buckling magnitudes can be greater than 20 micron (peak to valley). For a gas gap of approximately 200 μm, this corresponds to a 10% variation in thickness, and corresponding temperature variation. This can result in up to 60° C. variations in temperature around the wafer edge.

In order to solve this problem, it is advantageous to ensure that the height h of the gas gap varies by no more than 100 μm, 80 μm, 60 μm, 40 μm, 20 μm, 10 μm, 5 μm, or 2 μm. This may be achieved, for example, by further processing the rear surface of substrates provided by suppliers to have a very precisely defined profile which is complementary to the profile of the supporting surface of the substrate holder. For example, if the supporting surface of the substrate holder is flat, then the rear surface of the substrate should be processed to ensure that it is very precisely flat.

Accordingly, control of rear surface substrate shape by mechanical means (preferably uniform, non-directional processing, e.g. lapping rather than grinding) has been found to be advantageous. Furthermore, the supporting surface of the substrate holder may also be processed to have a precisely defined profile which is complementary to the rear surface of the substrate.

In addition to the above, it has also been found that some cylindrical refractory metal substrates provided by suppliers do not result in uniform, high quality CVD diamond wafers, even if both front and rear surfaces were processed as outlined above. Commercially available refractory metals often contain small amounts of graphite forming impurities such as iron and nickel. Even very small proportions of such impurities have been found to affect CVD diamond growth on the growth surface of such a substrate. Accordingly, in addition to applying the precise processing of both front and rear surfaces of the substrate as previously described, it is advantageous to use a carbide forming refractory metal substrate which has very high chemical purity with less than 0.5%, 0.1%, 0.075%, 0.05%, 0.025%, 0.01%, 0.005%, or 0.001% by weight of graphite forming impurities at the growth surface of the substrate.

Optionally, the growth surface has a surface roughness Ra in the range 1 nm to 1 μm. It has been found that the roughness of the growth surface can affect both the crystal structure of the CVD diamond grown thereon and adhesion strength of the CVD diamond to the substrate. It has been found that a surface roughness Ra in the range 1 nm to 1 μm has been found to be particularly useful to provide sufficient adhesion to the CVD diamond during growth to prevent early delamination during growth while providing a sufficiently low adhesion such that the diamond material can be released from the substrate on cooling after CVD growth without the material cracking. Preferred range of surface roughness may be 1 nm to 500 nm, 10 nm to 500 nm, 10 nm to 200 nm. Typically, the refractory metal discs are first lapped on a cast iron wheel using diamond grit suspended in a lapping fluid. In general, the lapping process is used for bulk material removal and also to achieve the required flatness for the given process. There are a few processes where the as-lapped surface is used. A typical Ra value for the lapped finish is 100 nm to 500 nm. However, usually the lapped surface is then further processed using, for example, a grinding/polishing machine and using a finer grit to obtain a lower surface roughness value. Prior to CVD diamond growth, the refractory metal substrates may be cleaned to ensure all contamination from the lapping process has been removed and/or seeded to aid nucleation for diamond growth thereon.

Process Conditions

A critical factor in obtaining polycrystalline CVD diamond wafers using a microwave plasma reactor with a commercially adequate yield and adequate transmission properties is the control of the temperature difference between the central region of the substrate growth surface and the edge of the substrate growth surface. As mentioned above, a small difference where the edge temperature of the substrate growth surface is lower than the temperature in the central region of the substrate growth surface can be tolerated. This is because crack propagation can be minimised by ensuring that compressive regions within the CVD diamond material are near where cracks can originate, i.e. near the edge of the CVD diamond wafer.

Figure 7:
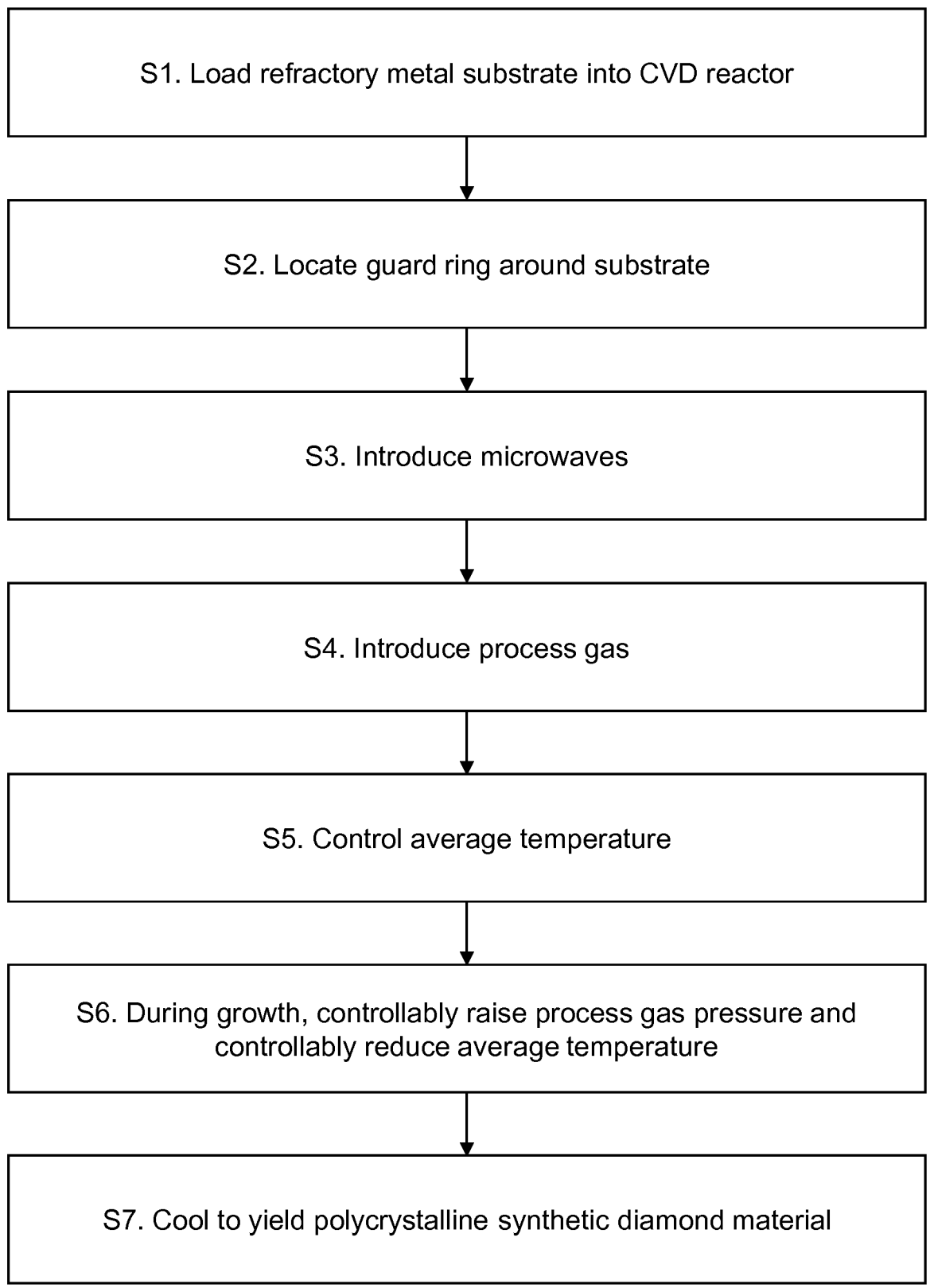
FIG. 7 is a flow diagram showing exemplary steps.

Using the aforementioned apparatus, a process has been developed for fabricating thick, high thermal conductivity polycrystalline CVD synthetic diamond material at adequate growth rates. The process is shown in FIG. 7, with the following numbering corresponding to that of the figure:

S1. A refractory metal substrate is loaded into a CVD reactor.

S2. A refractory metal guard ring is located around a peripheral region of the refractory metal substrate. The refractory metal guard ring defines a gap between an edge of the refractory metal substrate and the refractory metal guard ring, the gap having a width 1.5 mm to 5.0 mm.

S3. Microwaves are introduced into the CVD reactor at a power such that the power density in terms of power per unit area of the refractory metal substrate is in a range 2.5 to 4.5 W mm$^{-2}$.

S4. Process gas is introduced into the CVD reactor. The process gas within the CVD reactor comprises a nitrogen concentration in a range 600 ppb to 1500 ppb calculated as molecular nitrogen $N_2$, a carbon containing gas concentration in a range 1.5% to 3.0% by volume, and a hydrogen concentration in a range 92% to 98.5% by volume.

S5. An average temperature of the refractory metal substrate is controlled such that it lies in a range 750° C. to 950° C. and maintains a temperature difference between an edge and a centre point on the refractory metal substrate of no more than 80° C. A polycrystalline CVD synthetic diamond wafer is grown to a thickness of at least 2.5 mm on the refractory metal substrate. Growth temperature is measured using a pyrometer unit, where infra-red emission from a surface is captured and translated into a temperature.

S6. During the growing stage, the pressure of the process gas is increased in a controlled manner and the average power per unit area of the refractory metal substrate is decreased in a controlled manner. This has surprisingly been found to limit the temperature difference between the edge temperature and the temperature in the central region. This may be because the size of the plasma ball over the surface is reduced during the growth period and the electromagnetic field is better distributed over the surface of the substrate. This reduces the temperature difference between the centre of the surface and the edge of the surface. This is turn ensures that the arrival rate of growth species is better distributed over the surface, and so the growth rate at the edges of the surface remains more closely aligned with the growth rate towards the centre of the surface.

S7. The resultant polycrystalline CVD synthetic diamond wafer is subsequently cooled. The polycrystalline CVD diamond wafer has a thickness of at least 2.5 mm and an average thermal conductivity at room temperature through the thickness of the polycrystalline CVD synthetic diamond wafer of between 1700 and 2400 Wm$^{-1}$K$^{-1}$ over at least a central area of the polycrystalline CVD synthetic diamond wafer. The central area is at least 70% of a total area of the polycrystalline CVD synthetic diamond wafer. The polycrystalline CVD synthetic diamond wafer is substantially crack free over at least the central area thereof such that the central area has no cracks which intersect both external major faces of the polycrystalline CVD synthetic diamond wafer and extend greater than 2 mm in length.

The diameter of the refractory metal substrate may lie in a range 60 mm to 120 mm, 80 mm to 110 mm, 90 mm to 110 mm, or 95 mm to 105 mm. The diameter of the refractory metal substrate may be optimized to balance the following parameters:

(a) Number of product discs which can be extracted from an as-grown wafer. For example, a 90 mm diameter substrate has a maximum yield of 12×20 mm diameter product discs whereas a 100 mm diameter substrate has a maximum yield of 16×20 mm diameter product discs if cut from the as-grown wafer in a symmetric pattern. This can actually be increased to 17 product discs if cut from the as-grown 100 mm diameter wafer with an irregular, offset pattern.

(b) Power density. If the diameter of the substrate is decreased then the power density per unit area of the substrate is increased for a given microwave power input to the reactor chamber. The power density may be defined as the total power absorbed per unit area of the substrate and/or the total power delivered per unit area of the substrate.

(c) Power/pressure handling capability. If the diameter of the substrate is increased then it has been found that the power/pressure handling capability of the substrate can be increased. For example, it has been found that 100 mm substrates have a higher power/pressure handling capability than 90 mm substrates, at least for the reactor configuration described herein, and readily give higher growth rates for apparently similar quality material.

(d) Uniformity of product material. If the diameter of the substrate is increased then it has been found that the quality of material can decrease in peripheral regions of an as-grown wafer.

Taking all the aforementioned parameters into account, it has been found that for synthesis of thick, high thermal conductivity polycrystalline diamond at commercially adequate growth rates, a substrate diameter of around 100 mm is preferred, although this could be increased with improvements to control parameters.

The power density may be in a range 2.75 to 4.25 W mm$^{-2}$, 3.0 to 4.0 W mm$^{-2}$, 3.2 to 3.8 W mm$^{-2}$, or 3.3 to 3.6 W mm$^{-2}$. Furthermore, an operating pressure during growth of the polycrystalline CVD synthetic diamond material may be controlled within a range 100 to 300 Torr, 150 to 250 Torr, 175 to 225 Torr, or 195 to 205 Torr. While high power density and high pressure conditions have been found to be advantageous for synthesis of thick, high thermal conductivity polycrystalline diamond material at high growth rates, if the power density and pressure are made too high then the growth conditions become less stable and more difficult to control in a uniform manner.

Using the substrate diameter and power density/gas pressure parameters defined above, it has been found that the following process gas composition is preferred:

(a) a nitrogen concentration, calculated as molecular nitrogen $N_2$, in a range 600 ppb to 1500 ppb, 700 ppb to 1300 ppb, 800 ppb to 1200 ppb, or 900 ppb to 1100 ppb;

(b) a carbon containing gas concentration in a range 1.5% to 3.0%, 1.6% to 2.5%, 1.7% to 2.3%, or 1.8 to 2.1% by volume;

(c) a hydrogen concentration in a range 92% to 98.5%, 94% to 97%, or 95% to 96% by volume.

In this regard, high nitrogen and carbon containing gas concentrations are desirable to increase the growth rate of the material. However, if the nitrogen and carbon containing gas concentrations are made too high then the quality and thermal conductivity of the product material decreases below desired levels. An inert gas such as argon may also be introduced into the process gas.

In relation to the above, the carbon containing gas concentration and the hydrogen concentration are calculated as the concentration of those gases introduced into the CVD reactor. Nitrogen gas is also added into the CVD reactor but is also present as an impurity. The nitrogen concentration in the CVD reactor may be measured by, for example, gas chromatography as described in WO0196633, and is the sum of the nitrogen gas intentionally added into the CVD reactor and the nitrogen present as an impurity. Nitrogen may be present in a number of different forms within the CVD reactor including atomic nitrogen and various forms of molecular nitrogen. As such, in the present specification nitrogen concentrations have been calculated as the equivalent concentration of molecular nitrogen $N_2$. Typically, nitrogen may be present as an impurity at a level up to around 300 ppb depending on the purity of the source gases utilized. The concentration of nitrogen intentionally added (i.e. excluding impurity nitrogen content) will typically be less than the measured nitrogen concentration which includes impurities. For example, the nitrogen concentration intentionally added into the CVD reactor may be in a range 600 ppb to 1200 ppb, 600 ppb to 1000 ppb, 620 ppb to 800 ppb, or 640 ppb to 700 ppb.

The average temperature of the refractory metal substrate may be controlled to lie in a range 775° C. to 900° C., 800° C. to 875° C., or 820° C. to 860° C. Furthermore, the temperature difference between an edge and a centre point on the refractory metal substrate may be controlled to be no more than 60° C., 40° C., 20° C., or 10° C. The substrate temperature can affect growth rates and impurity uptake. Furthermore, large temperature differences between an edge and a centre point of the substrate can lead to thermally induced stress and wafer cracking on cooling. As such, careful control of substrate temperature using a gas gap arrangement as previously described is advantageous in alleviating these problems.

To further reduce the risk of thermal cracking, a refractory metal guard ring may be located around a peripheral region of the refractory metal substrate, the refractory metal guard ring defining a gap between an edge of the refractory metal substrate and the refractory metal guard ring having a width 1.5 mm to 5 mm. The refractory metal guard ring must be located and configured to remove heat from the edge of the substrate while not being positioned and configured such that polycrystalline CVD diamond material overgrows the guard ring inhibiting release of the wafer after growth.

In light of the above, a refractory metal guard ring can be located around a peripheral region of the refractory metal substrate, the gap between the edge of the refractory metal substrate and the refractory metal guard ring having a width in a range 1.5 mm to 5 mm, 2 mm to 4 mm, or 2.5 mm to 3.5 mm. The height, cross-sectional width, and cross-sectional shape can be configured to optimize temperature control at the edge of the substrate while alleviate problems of diamond growth on the guard ring. The height of the guard ring above the support substrate is approximately equal to the height of the upper surface of the substrate. For example, the height of the guard ring may be within 20 mm, 15 mm, 10 mm, 5 mm, or 3 mm of the height of the substrate.

Product

Using the apparatus and process conditions as described above, it is possible to fabricate a thick, high thermal conductivity polycrystalline CVD diamond wafer at commercially adequate growth rates. The polycrystalline CVD diamond wafer comprises:

- an average thermal conductivity at room temperature through a thickness of the polycrystalline CVD synthetic diamond material of between 1700 and 2400 $Wm^{-1}K^{-1}$ measured over at least a central area of the polycrystalline CVD synthetic diamond wafer, wherein the central area is at least 70% of a total area of the polycrystalline CVD synthetic diamond wafer;
- a thickness of at least 2.5 mm; and
- a visible transmittance through the thickness of the polycrystalline CVD synthetic diamond wafer of at least 25% over at least the central area of the polycrystalline CVD synthetic diamond material.

The polycrystalline CVD synthetic diamond material is substantially crack free over at least the central area such that the central area has no cracks which intersect both external major faces of the polycrystalline CVD synthetic diamond material and extend greater than 2 mm in length.

The increase in power density off-sets the increase the carbon containing gas and nitrogen in the synthesis process such that the non-diamond carbon content of the product is not unduly increased and the nitrogen content is actually decreased. This is due to an increase in atomic hydrogen flux to the growth surface which effectively cleans the material during growth allowing a high thermal conductivity material to be fabricated at higher growth rates. As such, the process gas composition and the power density may be balanced to achieve the desired product. In this regard, the polycrystalline CVD synthetic diamond wafer may comprise a single substitutional nitrogen concentration no more than 0.70 ppm, 0.60 ppm, 0.50 ppm, or 0.45 ppm. Furthermore, the polycrystalline CVD synthetic diamond wafer may comprise a single substitutional nitrogen concentration no less than 0.10 ppm, 0.20 ppm, 0.30 ppm, or 0.35 ppm. If too much nitrogen is provided then the growth rate is increased too much and the quality of material is too low. While the power density could be further increased to counteract this effect, the power handling capability of the apparatus to sustain stable growth is limiting. Conversely, if too little nitrogen is provided then the growth rate of the material is too low to achieve thick wafers in a commercially viable manner.

In relation to the above, it may be noted that the single substitutional nitrogen concentration can be measured spectroscopically by the increase in absorption at 270 nm. Samples are double side polished and acid cleaned. Spectra are then collected between 200-1800 nm. Raw spectrometer data is converted into absorption coefficient data through the equation $$A(cm^{-1}) = \ln 10 \frac{(S-B)}{t}$$

where A is the absorption coefficient, S is the measured signal from the spectrometer, B is the background signal taken at 1800 nm, and t is the thickness of the sample (cm). The single substitutional nitrogen content is proportional to the absorption coefficient increase at 270 nm, where the proportionality constant is 0.7114. The increase in absorption is calculated by subtracting a linear background from the region 240 nm to 300 nm. Data indicates that that the single substitutional nitrogen content of the new polycrystalline CVD synthetic diamond material grown at higher power densities and growth rates is approximately half that of material which has a comparable thermal conductivity but which is grown at lower power densities and growth rates.

Figure 8:
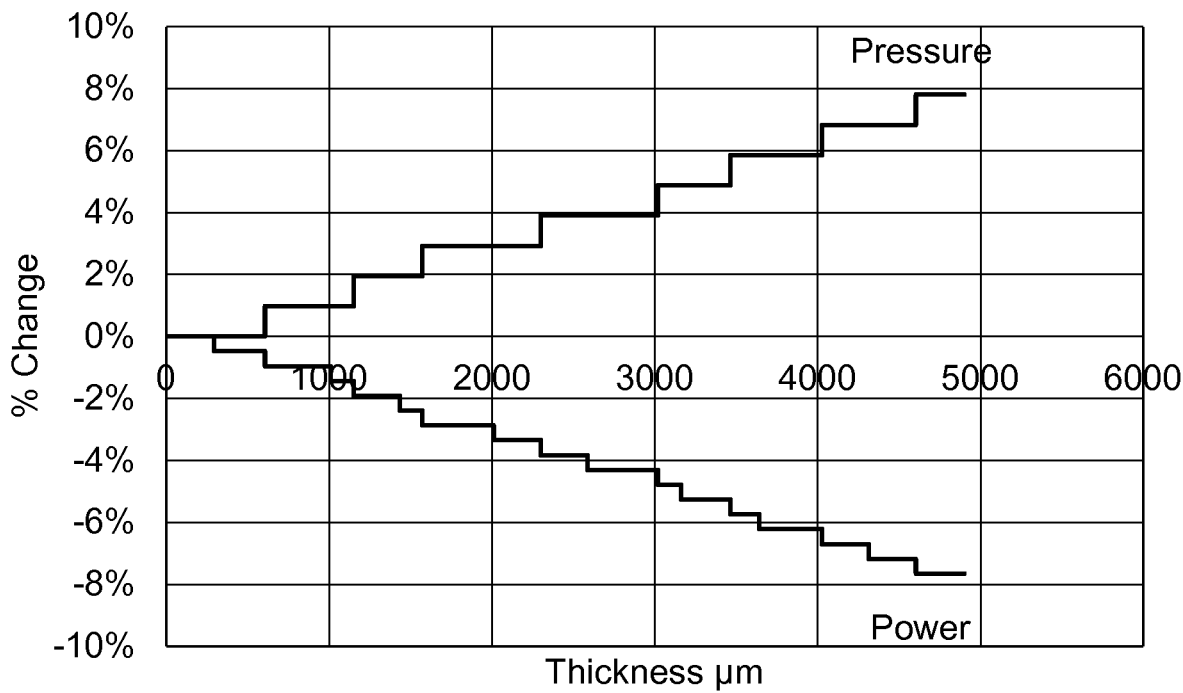
FIG. 8 is a graph showing process gas pressure and microwave power during a growing stage.

Turning now to FIG. 8, there is shown a graph of process gas pressure and microwave power during a growing stage. It can be seen that the diamond wafer was grown to almost 5 mm thick. In this time, the process gas pressure was increased by almost 8% from its original value. The power was reduced by almost 8% from its original value during the growth stage. These changes in power and pressure prevent the edge temperature of the refractory substrate from raising too far above the centre temperature of the refractory substrate.

Figure 9:
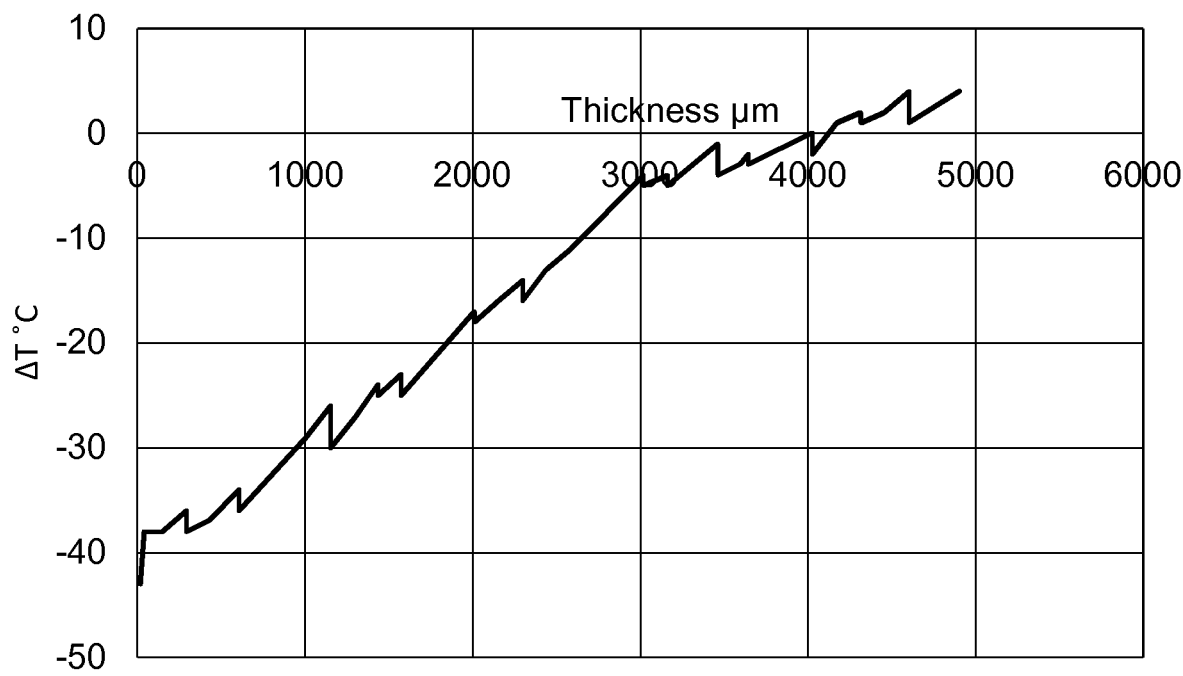
FIG. 9 is a graph showing the difference in temperature between an edge and a centre of a substrate during a growing stage

FIG. 9 is a graph showing the difference in temperature between the centre of a refractory substrate and the temperature at the edge of the refractory substrate during a growing stage. The edge temperature increases during the growth stage, and the centre temperature also increases but at a slower rate. The difference between the temperature at the edge of the refractory substrate and the centre of the refractory substrate therefore reduces during the growth stage. By the end of the growth stage, the temperature difference is less than 10° C. This greatly reduces the risk of cracking of the diamond wafer during growth and also when the diamond wafer is subsequently cooled.

Diamond Samples were prepared with a thickness of 4 mm, and the transmission in the visible and UV ranges was measured. A correlation was found between both the UV and visible transmission, and also between the transmission and the growth rate.

Figure 10:
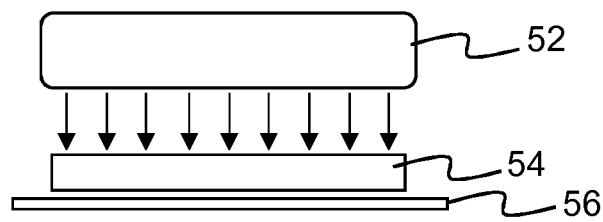
FIG. 10 illustrates schematically in a block diagram a technique for measuring transmission of a diamond sample.

The UV measurement method is illustrated in FIG. 10, in which a source of UV light (long wave 365 nm) 52 was used to illuminate a first side of a diamond sample 54. A UV sensitive film 56 was located on an opposing side of the diamond sample 54. The diamond sample 54 was illuminated for 30 minutes. Grain boundary scatter of the UV light is accounted for by using a sample with a largest linear dimension significantly larger than the average grain size. The illuminated film 56 became coloured according to the exposure energy density of UV (and hence was affected by the transmission of the diamond sample 54). The energy density on the film was evaluated by comparing the colour of the film against a colour chart provided with the UV film using image processing software.

Figure 11:
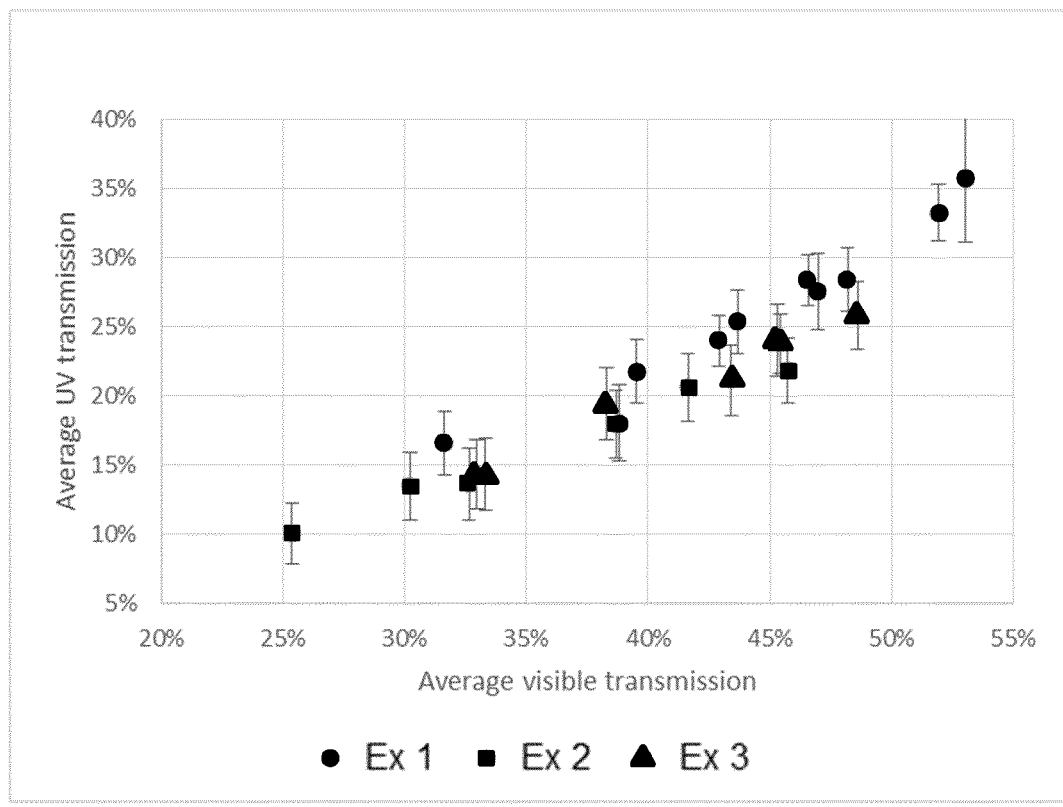
FIG. 11 is a graph showing average UV transmission against average visible transmission for three exemplary materials.

A similar technique was used to measure visible white light transmission. Measurements of the UV and visible transmission of exemplary diamond wafer samples with a 4 mm thickness from three synthesis runs using the same nominal synthesis process described above is shown in FIG. 11. The average transmission in the UV and the visible of the three examples is given. It was also noted that the average UV and visible transmission was inversely related to the mean growth rate.

Some correlation between the growth rate and transmission is indicated in the data; lower growth rates leading to higher transmission.

TABLE 1

| Batch | Mean visible % T | Mean UV % T |
|---|---|---|
| Example 1 | 45% | 27% |
| Example 2 | 36% | 16% |
| Example 3 | 41% | 20% |

Thermal conductivity can be measured in thick diamond wafers using the proven relationship between thermal conductivity and the CHx component of the FTIR absorption spectrum. This relationship is described in "Thermal conductivity measurements on CVD diamond", by Twitchen et al, Diamond and related materials, 10 (2001) 731-735. The integrated area of the CHx components in the region 2760 $cm^{-1}$ to 3030 $cm^{-1}$ of the IR spectrum of the diamond window, once corrected with a linear baseline, has been shown to be quantitatively related to the thermal conductivity of diamond.

Alternatively, a laser flash technique can be used to measure thermal conductivity through the thickness of a polycrystalline CVD synthetic diamond material. Laser flash is a one-dimensional measurement of thermal diffusivity. The measurement involves the absorption of energy at the front face of a sample, and subsequently measuring the temperature rise profile at the rear face of that piece. The thermal diffusivity (a) is given by the equation:

$$\alpha = 0.1388 \cdot \frac{d^2}{\tau_{\frac{1}{2}}}$$

where d is the thickness of the sample and $\tau_{1/2}$ is the time to half the maximum temperature. This thermal diffusivity can be converted to a thermal conductivity using the equation:

$$\alpha = \frac{k}{\rho c_p}$$

where k is the thermal conductivity, ρ is the density of the material, and $c_p$ is the specific heat capacity. The standard for laser flash measurement of thermal conductivity is BS EN 821-2:1997.

It should be noted that the thermal conductivity of a polycrystalline CVD synthetic diamond wafer will change on passing through the thickness of the wafer due to variations in grain size along with variations in impurity and/or defect concentration. As such, in the present specification thermal conductivities are measured as an average value through the thickness of a wafer of the polycrystalline CVD synthetic diamond material. If a measurement technique is not suitable for measuring thermal conductivity through the entire thickness of a wafer in a single measurement due to the wafer being too thick, then the wafer may be split into two or more thinner sections, the thermal conductivity of each section measured, and then an average thermal conductivity value calculated.

It will be appreciated that a polycrystalline CVD synthetic diamond wafer grown according to the present invention may have a portion of it nucleation face removed by post-synthesis processing to increase the average through-thickness thermal conductivity of the wafer.

The polycrystalline CVD synthetic diamond wafer may have an as-grown diameter in a range 60 mm to 120 mm, 80 mm to 110 mm, 90 mm to 110 mm, or 95 mm to 105 mm. As previously discussed, the diameter may be optimized to balance the area of wafer produced against material quality, material uniformity, and the power handling capability of the substrate.

The polycrystalline CVD synthetic diamond wafer may have a thickness of at least 2.5 mm, 2.75 mm, 3.0 mm, 3.25 mm, or 3.5 mm. The thickness will depend on the intended end-use. As previously discussed, as material is grown to greater thickness the grain size of the polycrystalline material increases as does the rate of impurity uptake. As such, growing a high thermal conductivity wafer to very thick dimensions is difficult. However, the present inventors have demonstrated that the apparatus and process as described herein is capable of fabricating high thermal conductivity wafers over 3.5 mm in thickness.

The substrate configuration including temperature control via a gas gap and a suitably configured guard ring structure allow crack free wafers to spontaneously delaminate from the substrate on cooling. In this regard, the wafers may be substantially crack free over a central area of the wafer which is at least 75%, 80%, 85%, 90%, 95%, or 99% of the diameter of the wafer.

The as-grown polycrystalline CVD synthetic diamond wafer may be used in large area form or otherwise may be cut into smaller items depending on the end application. An example of a smaller item that can be cut from the wafer (typically from the central area of the wafer where the properties are more reproducible) is a heat spreader for a disk laser, as described above. In this case the diamond material has the properties of an average thermal conductivity at room temperature through a thickness of the polycrystalline CVD synthetic diamond material of between 1700 and 2400 $Wm^{-1}K^{-1}$, a thickness of at least 2.5 mm, and a visible transmittance through the thickness of the polycrystalline CVD synthetic diamond of at least 25%. The diameter of such a material is at least 20 mm.

While this invention has been particularly shown and described with reference to preferred embodiments, it will be understood to those skilled in the art that various changes in form and detail may be made without departing from the scope of the invention as defined by the appendant claims. For example, the diamond material need not be monolithic, but could be formed of multiple pieces joined together, for example by brazing.

The invention claimed is:

1. A method of fabricating a polycrystalline CVD synthetic diamond wafer, the method comprising:
    loading a refractory metal substrate into a CVD reactor;
    introducing microwaves into the CVD reactor at a known power density in terms of power per unit area of the refractory metal substrate;
    introducing process gas into the CVD reactor, wherein the process gas within the CVD reactor comprises nitrogen, a carbon containing gas, and hydrogen;
    controlling an average temperature of the refractory metal substrate to lie in a range 750° C. to 950° C. and to maintain a temperature difference between an edge and a centre point on the refractory metal substrate of no more than 80° C.;
    growing a polycrystalline CVD synthetic diamond wafer to a thickness of at least 2.5 mm on the refractory metal substrate;
    during the growing stage, increasing the pressure of the process gas and reducing the average power per unit area of the refractory metal substrate; and
    subsequently cooling the polycrystalline CVD synthetic diamond wafer to yield a polycrystalline CVD synthetic diamond wafer having a thickness of at least 2.5 mm, an average thermal conductivity at room temperature through the thickness of the polycrystalline CVD synthetic diamond wafer of between 1700 and 2400 $Wm^{-1}K^{-1}$ over at least a central area of the polycrystalline CVD synthetic diamond wafer, wherein the central area is at least 70% of a total area of the polycrystalline CVD synthetic diamond wafer, and wherein the polycrystalline CVD synthetic diamond wafer is substantially crack free over at least the central area thereof such that the central area has no cracks which intersect both external major faces of the polycrystalline CVD synthetic diamond wafer and extend greater than 2 mm in length.

2. The method according to claim 1, further comprising increasing the pressure of the process gas within the CVD reactor such that the pressure at the end of the growing stage is at least any of 5, 10 and 15% higher than the pressure at the start of the growing stage.

3. The method according to claim 1, wherein the refractory metal substrate has a diameter which lies in a range 60 mm to 120 mm, 80 mm to 110 mm, mm to 110 mm, or 95 mm to 105 mm.

4. The method according to claim 1, wherein the average temperature of the refractory metal substrate is controlled to lie in a range 775° C. to 900° C., 800° C. to 875° C., or 820° C. to 860° C.

5. The method according to claim 1, wherein the temperature difference between the edge and the centre point on the refractory metal substrate is no more than 60° C., 40° C., 20° C., or 10° C.

6. The method according to claim 1, wherein the power density is in a range 2.5 to 4.5 $Wmm^{-2}$, 2.75 to 4.25 $Wmm^{-2}$, 3.0 to 4.0 $Wmm^{-2}$, 3.2 to 3.8 $Wmm^{-2}$, or 3.3 to 3.6 $Wmm^{-2}$.

7. The method according to claim 1, wherein an operating pressure during growth of the polycrystalline CVD synthetic diamond material is controlled within a range 100 to 300 Torr, 150 to 250 Torr, 175 to 225 Torr, or 195 to 205 Torr.

8. The method according to claim 1, further comprising after loading the refractory metal substrate into the CVD reactor, locating a refractory metal guard ring around a peripheral region of the refractory metal substrate, the refractory metal guard ring defining a gap between an edge of the refractory metal substrate and the refractory metal guard ring having a width 1.5 mm to 5.0 mm.

* * * * *